United States Patent
Wang

(10) Patent No.: US 7,606,069 B2
(45) Date of Patent: *Oct. 20, 2009

(54) BIT-SYMBOL RECOGNITION METHOD AND STRUCTURE FOR MULTIPLE-BIT STORAGE IN NON-VOLATILE MEMORIES

(75) Inventor: Lee Wang, Diamond Bar, CA (US)

(73) Assignee: FlashSilicon Incorporation, Diamond Bar, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/113,117

(22) Filed: Apr. 30, 2008

(65) Prior Publication Data

US 2008/0266947 A1   Oct. 30, 2008

Related U.S. Application Data

(63) Continuation of application No. 11/378,074, filed on Mar. 16, 2006, now Pat. No. 7,400,527.

(51) Int. Cl.
*G11C 16/04* (2006.01)

(52) U.S. Cl. .......................... 365/185.03; 365/185.18; 365/185.19; 365/185.28

(58) Field of Classification Search ............ 365/185.03, 365/185.18, 185.19, 185.28
See application file for complete search history.

(56) References Cited

U.S. PATENT DOCUMENTS 7,400,527 B2 *   7/2008   Wang .................... 365/185.03

* cited by examiner

*Primary Examiner*—Hoai V Ho
(74) *Attorney, Agent, or Firm*—Haynes and Boone, LLP

(57) ABSTRACT

Storage of information represented by a multi-bit word in a single non-volatile memory cell is made possible by programming the threshold voltage of the non-volatile memory to a specific threshold level corresponding to the multi-bit word. Stored or generated multi-bit words are scanned and converted into a gate voltage to be applied to the non-volatile memory cell until the electrical response from the non-volatile memory cell indicates that the voltage generated from the specific multi-bit word which has been applied to the gate matches the information stored in the non-volatile memory cell. The matched multi-bit word is read out of storage and represents the stored bits in the single non-volatile memory cell.

30 Claims, 14 Drawing Sheets

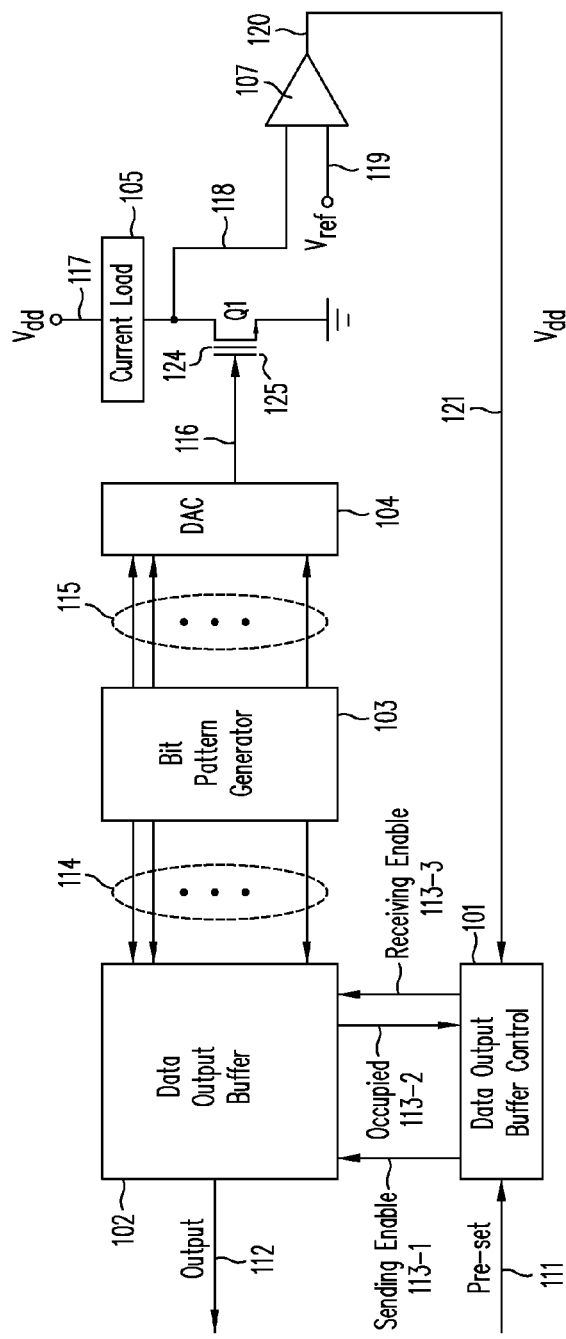

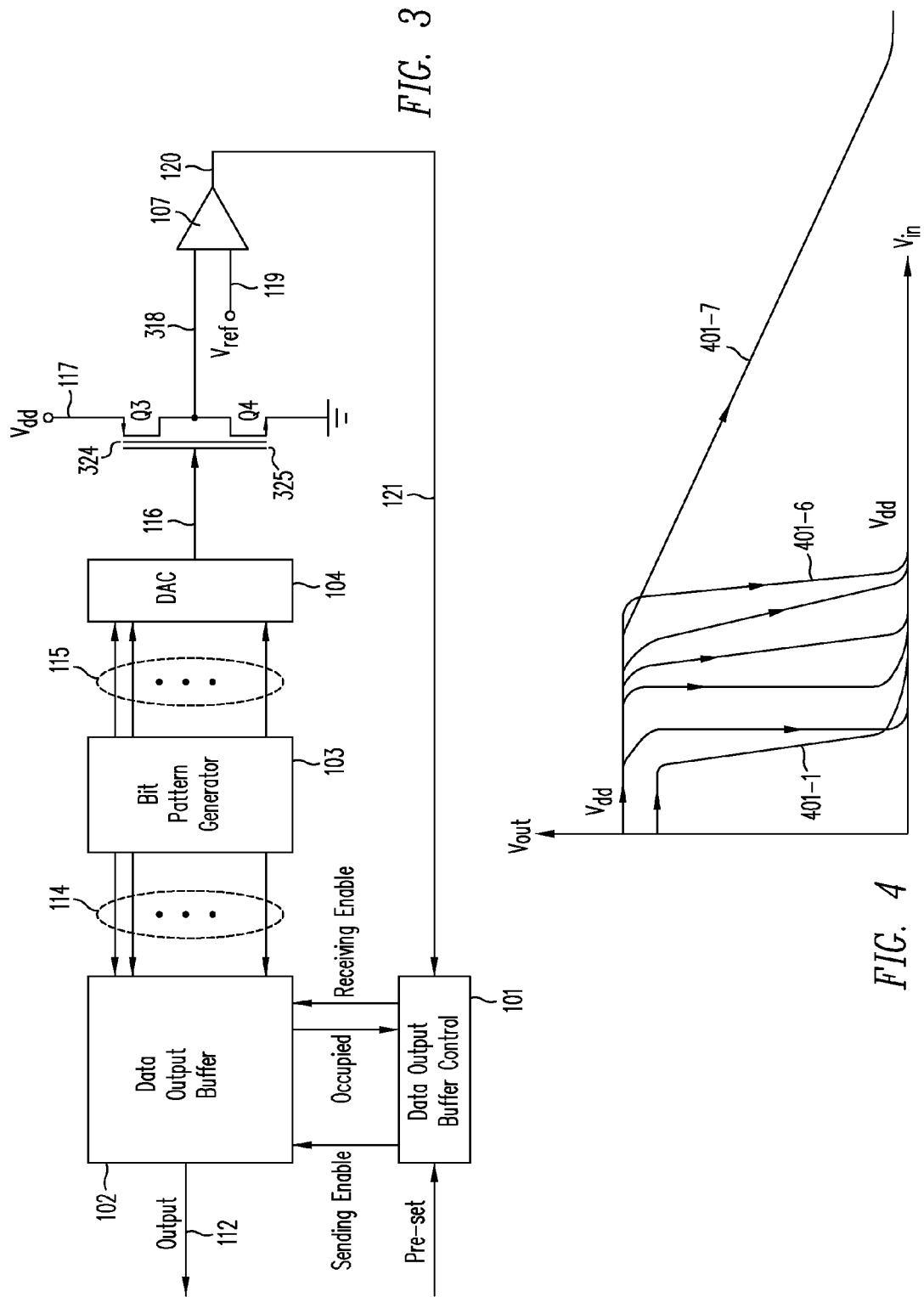

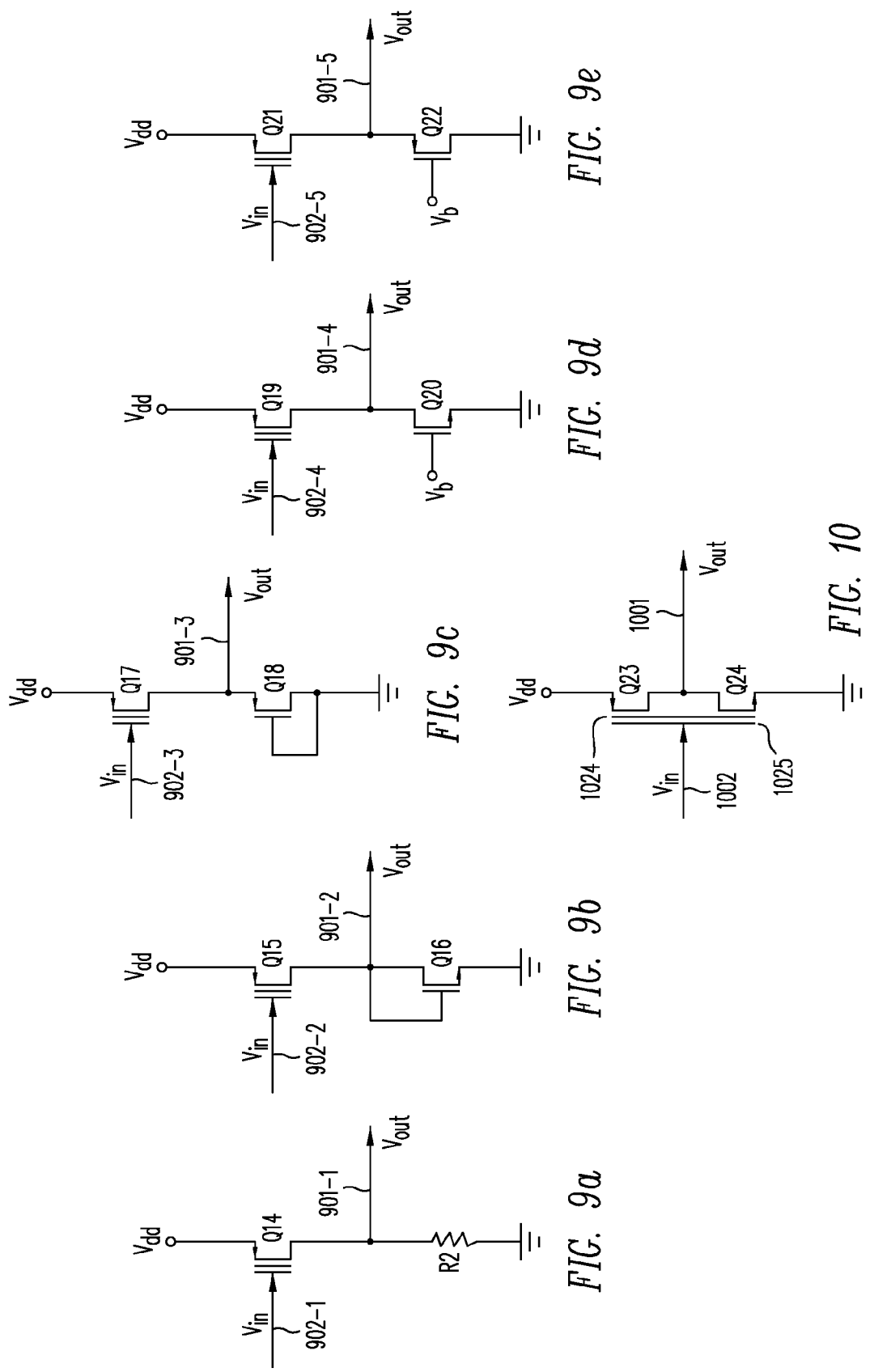

BIT-SYMBOL RECOGNITION METHOD AND STRUCTURE FOR MULTIPLE-BIT STORAGE IN NON-VOLATILE MEMORIES

CROSS-REFERENCE TO RELATED APPLICATIONS

The present application is a continuation of U.S. patent application Ser. No. 11/378,074 filed Mar. 16, 2006 by Lee Wang entitled "BIT SYMBOL RECOGNITION METHOD AND STRUCTURE FOR MULTIPLE BIT STORAGE IN NON-VOLATILE MEMORIES", issued as U.S. Pat. No. 7,400,527 on Jul. 15, 2008 which is incorporated herein by reference in its entirety.

FIELD OF THE INVENTION

This invention relates to the storage of multiple bits in a single non-volatile memory cell and in particular to a method for sensing and reading out the multi-bit information stored in a single non-volatile memory cell, the resulting structure, and arrays of such cells.

BACKGROUND OF THE INVENTION

It is well known that a non-volatile memory device such as a MOSFET (a "metal oxide semiconductor field effect transistor") with a floating gate can store varying amounts of charge on the floating gate. The amount of charge stored on the floating gate alters the threshold voltage of the device (i.e., gate voltage at which the underlying MOS transistor turns on) in a well-known manner. Different amounts of charge on the floating gate correspond to different threshold voltages for the underlying MOS transistor.

Semiconductor non-volatile memories ("NVM") and particularly electrically erasable, programmable read-only memories ("EEPROMs") are widely used in computers, telecommunications systems, consumer appliances and other electronic equipment. An EEPROM is a particular type of non-volatile memory, which is capable of storing firmware and data even when the power to the system is turned off. Moreover, the information stored in an EEPROM can be altered, erased and replaced as needed. A flash EEPROM is a specific type of EEPROM that can be erased globally or on a sector-by-sector basis, as required.

Data is stored in an EEPROM cell by injecting charge carriers in a well-known manner into the floating gate of the MOSFET from the channel of the MOSFET or onto a charge trapping dielectric layer in between the gate and the channel of the MOSFET. The floating gate or the charge-trapping dielectric layer is sometimes called the "charge storage layer". For example, with respect to an N-channel MOSFET, an accumulation of electrons in the floating gate (which basically comprises a conductive layer above but insulated from, the channel region of the MOSFET) increases the threshold voltage $V_{th}$ required to turn on the underlying field effect transistor. Overlying but insulated from the floating gate is a conductive gate (also called the "control gate") to which is applied a voltage which normally will cause the channel region between the source and drain of the underlying MOS field effect transistor to invert to the same conductivity type as the source and drain and thus "turn on" (i.e., allow current to flow from the source to the drain). When a fixed read voltage is applied to the gate of the MOSFET, the MOSFET will either turn on (i.e., allow current to flow from the source to the drain) or remain off depending on the value of $V_{th}$. The value of $V_{th}$ is controlled by the amount of charge placed on the floating gate and the impurity concentration in the channel of the MOSFET.

Both parallel and serial sensing have been proposed for use with a non-volatile memory cell which is capable of storing a plurality of bits. In conventional sensing schemes for reading a multi-level memory cell, the current or voltage response from an NVM cell resulting from applying a fixed read voltage to the control gate is compared to reference currents or voltages generated from different threshold voltage levels of identical non-volatile memory cells under the same condition. The parallel sensing method compares the response current or voltage from the memory cell simultaneously to the reference currents or voltages and determines the bit level for the non-volatile memory cell being read from the closest match.

The serial sensing method compares the current or voltage response from the non-volatile memory cell with the variable reference response controlled by a successive approximation register ("SAR") supplied with the output signal of a comparator. The SAR comprises a sequential network that, starting with a predetermined initial state, evolves through a succession of states, each one corresponding to one step of the serial binary search.

Basically, both parallel and serial sensing methods in the prior art compare the analog output electrical signal from a non-volatile memory cell to the analog output electrical signals from non-volatile memory cells with different threshold levels. In one system, the analog output electrical signal from a given non-volatile memory cell with a given control gate voltage is converted into a digital signature and compared to a plurality of analog electrical output signals generated from non-volatile memory cells with different threshold levels. The sense and determine scheme can be considered as a type of analog to digital converter ("ADC"). The analog electrical output signal, which provides the closest match represents the data stored on the memory cell being read and its digital counterpart is read out of the system.

Since the responses (i.e., either current or voltage) from the memory cells having multiple threshold levels under a fixed control gate voltage and fixed load condition are quite different, the previous conventional read schemes may not operate in a most optimized manner to determine the particular bits stored in a non-volatile memory cell. For example, applying a fixed control gate voltage to the control gate of a non-volatile memory cell with an unknown threshold voltage may lead to an electrical response corresponding to the linear region of a non-volatile memory cell having a low threshold voltage or to an electrical response in the saturation region of the underlying MOS device for a non-volatile memory cell having a higher threshold voltage. Operating from the linear region to the saturation region, the electrical response phasing between adjacent non-volatile memory cell threshold voltage levels will not be uniform over the full range of possible responses of the non-volatile memory cell.

The electrical response distribution of a non-volatile memory array after programming also depends on the non-uniform response characteristics of the array's MOS transistors due to different operating regions corresponding to different threshold voltage levels of these MOS transistors. Uneven separation between the electrical responses as a function of the threshold voltage levels leads to a distribution of responses from the memory cells which are dependent on the threshold levels. This uneven distribution hinders the capability to resolve more threshold voltage levels in a single non-volatile memory cell. Therefore, the available range of threshold voltage levels which can be programmed is limited due to limits on the applicable fixed gate voltages that can be used to read out the non-volatile memory cells in the prior art.

SUMMARY OF THE INVENTION

This invention recognizes that a threshold voltage can be represented in digital form by one or more bits. By assigning a specific threshold voltage level to a specific combination of digital bits (i.e., ones and zeroes) the specific combination of bits can match the selected threshold voltage of a non-volatile memory cell. As a result, when a voltage corresponding to that combination of bits is applied to the control gate of the non-volatile memory cell, the non-volatile memory cell will turn on thereby indicating that the information stored on the floating gate in the non-volatile memory cell corresponds to the bits used to generate the applied gate voltage. Thus, the turning on of the non-volatile memory cell informs the system in which the non-volatile memory cell is used of the particular information stored on the floating gate of the non-volatile memory device.

In accordance with this invention, instead of applying a fixed gate voltage to a non-volatile memory cell, a discrete scanning voltage is applied to the control gate of the cell. Each discrete gate voltage corresponds to a particular combination of bits representing a particular voltage in a range of possible voltages. The electrical responses from the non-volatile memory cell's MOS transistor in response to each voltage applied to the control gate of the transistor always reach or correspond to the most sensitive response region. The most sensitive response of the memory cell then can be used to determine the bits stored on the floating gate of the non-volatile memory. When the most sensitive response occurs (i.e., when the underlying MOS transistor associated with the particular non-volatile memory cell being read turns on), then the particular combination of bits representing the charge stored on the floating gate of the non-volatile memory cell can be determined because this particular combination of bits corresponds to the voltage applied to the control gate to turn on the underlying MOS transistor associated with the non-volatile memory cell.

The voltage applied to the control gate at which the source-to-drain current first appears (i.e. at which the transistor "turns on") can be recognized. The multi-bit word stored in memory which corresponds to the control gate voltage which matches the threshold voltage of the underlying MOS field effect transistor can be determined and therefore the charge stored on the floating gate of the EEPROM cell can be determined. This multi-bit word, which is then read out of memory, represents the charge stored on the floating gate.

The number of bits stored in the EEPROM cell is determined by the number of resolvable threshold voltage levels (i.e., the number of $V_{th}$) which can be detected. The more threshold voltages that can be sensed and resolved, the more bits that can be stored in a single non-volatile memory cell. The number of bits n that can be stored is log to the base 2 of the number of resolvable threshold voltage levels N. In other words, $$n = \log_2 N \quad (1)$$

For example, if N=16, then n=4. That is, four bits can be used to define 16 different threshold voltage levels. Thus, if 16 threshold levels can be sensed, then voltages corresponding to all possible combinations of four (4) bits can be stored in a single NVM cell. If 32 threshold voltage levels can be sensed and resolved, then voltages corresponding to all possible combinations of five (5) bits can be stored in a single NVM cell.

This invention will be more fully understood in conjunction with the following detailed description taken together with the attached drawings.

DETAILED DESCRIPTION OF THE DRAWINGS

FIG. 1 shows a schematic block diagram of one embodiment of this invention utilizing an N-channel transistor as the MOSFET associated with a non-volatile memory cell.

FIG. 2 shows a schematic block diagram of an embodiment of this invention utilizing a P-channel transistor as the MOSFET associated with a non-volatile memory cell.

FIG. 3 shows a schematic block diagram of an embodiment of this invention utilizing a CMOS transistor as part of the non-volatile memory cell in accordance with this invention.

FIG. 4 shows the Voltage Transfer Characteristics (VTC) of an MOS transistor used as an inverter with different types of pull-up or pull-down loads, when input voltages are applied to the control gate of the MOS transistor.

In FIG. 5 $V_{out}$ is uniquely coincident with reference voltage $V_{ref}$ when the horizontal line $V_{ref}$ and the parallel Voltage Transfer Characteristics (VTC) curves representing the NMOS transistor threshold voltage $V_{thi}$ for i=0, . . . , 15 intercept.

Figure 6A:
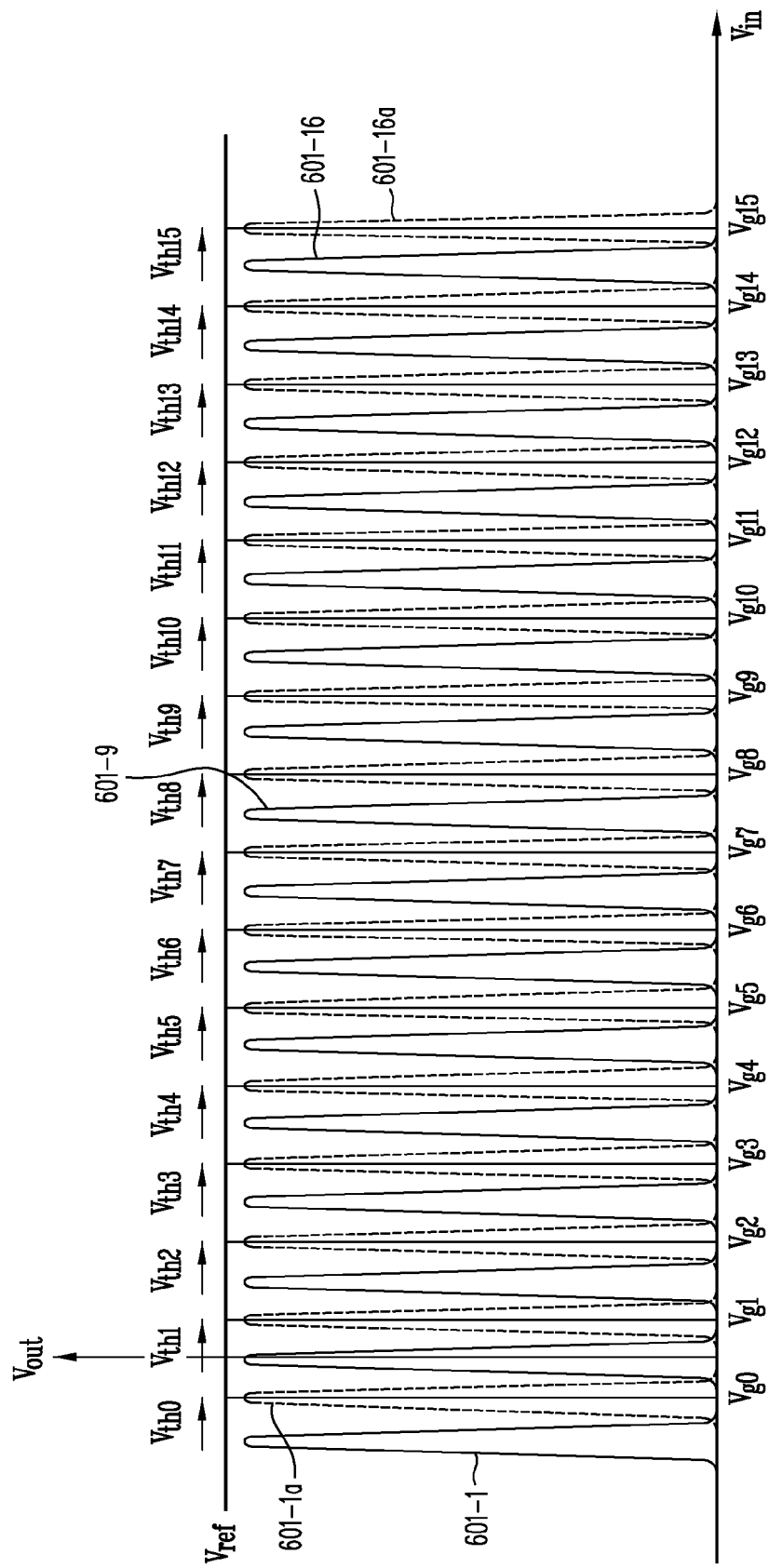
FIG. 6a shows the assumed threshold voltage distribution (solid line) at the threshold voltage level $V_{thi}$ of an NMOSFET NVM array after programming. The threshold voltage distribution can be uniquely transformed into the gate voltage distribution (dotted line) at $V_{gi}$ when the output voltage $V_{out}$ coincides with the reference voltage $V_{ref}$ in accordance with this invention.
Figure 6B:
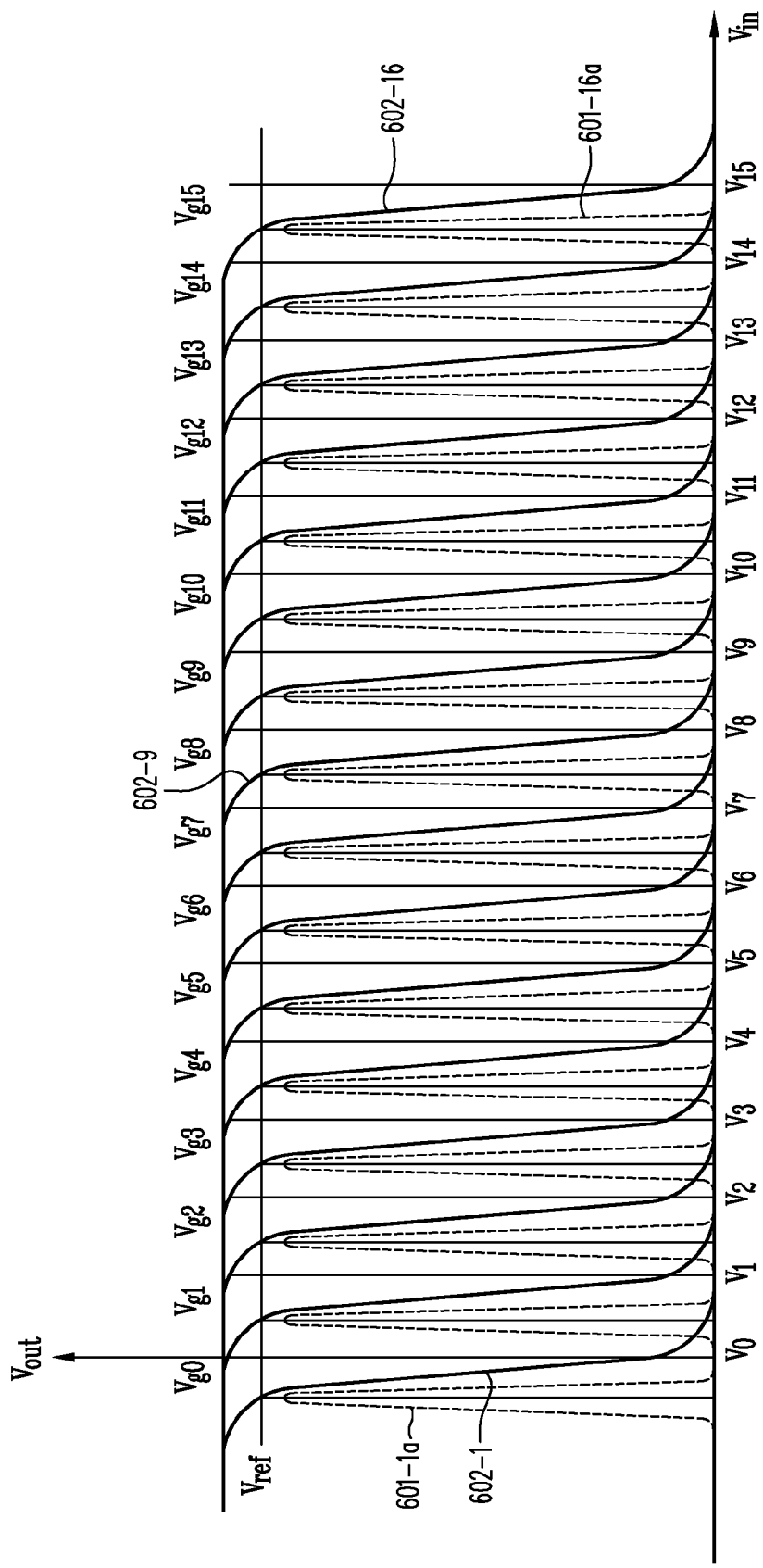

FIG. 6b shows the entire gate voltage distribution (dotted line) at $V_{gi}$ with the output voltage $V_{out}$ equal to the reference voltage $V_{ref}$ for the particular value of $V_{gi}$ equal to the peak value of $V_{gi}$ as shown on the corresponding dotted line curve. The entire distribution of $V_{gi}$ is shown to be between the input voltage $V_{i-1}$ and $V_i$. The output voltage responses $V_{out}$ for the NMOFET memory cells having the threshold voltage distribution at threshold voltage level $V_{thi}$ (FIG. 6a) invert from greater voltages to lesser voltages than the reference voltage $V_{ref}$, when the applied control gate voltage increases from $V_{i-1}$ to $V_i$ in accordance with this invention.

Figure 7A:
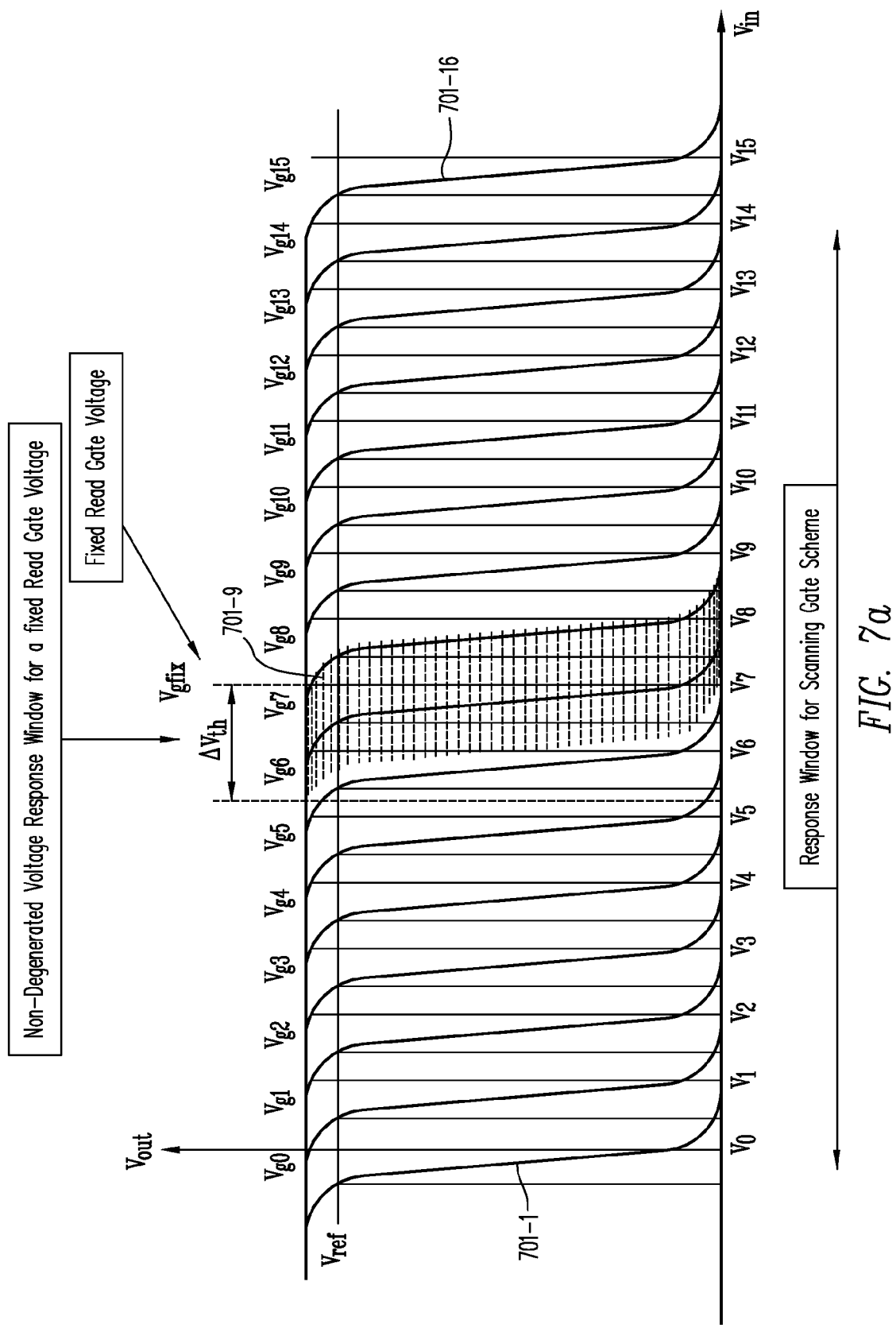

FIG. 7a shows the non-degenerated voltage response window (shaded region) associated with the fixed read gate voltage $V_{gfix}$ (vertical dotted line on the right of the non-degenerate window) for a specific load and an NMOSFET memory cell. The non-degenerate response allowable threshold voltage window $\Delta V_{th}$ is determined by intercepting the vertical line of $V_{gfix}$ with the parallel VTC curves (dotted) when the output voltage $V_{out}$ is neither $V_{dd}$ nor zero.

Figure 7B:
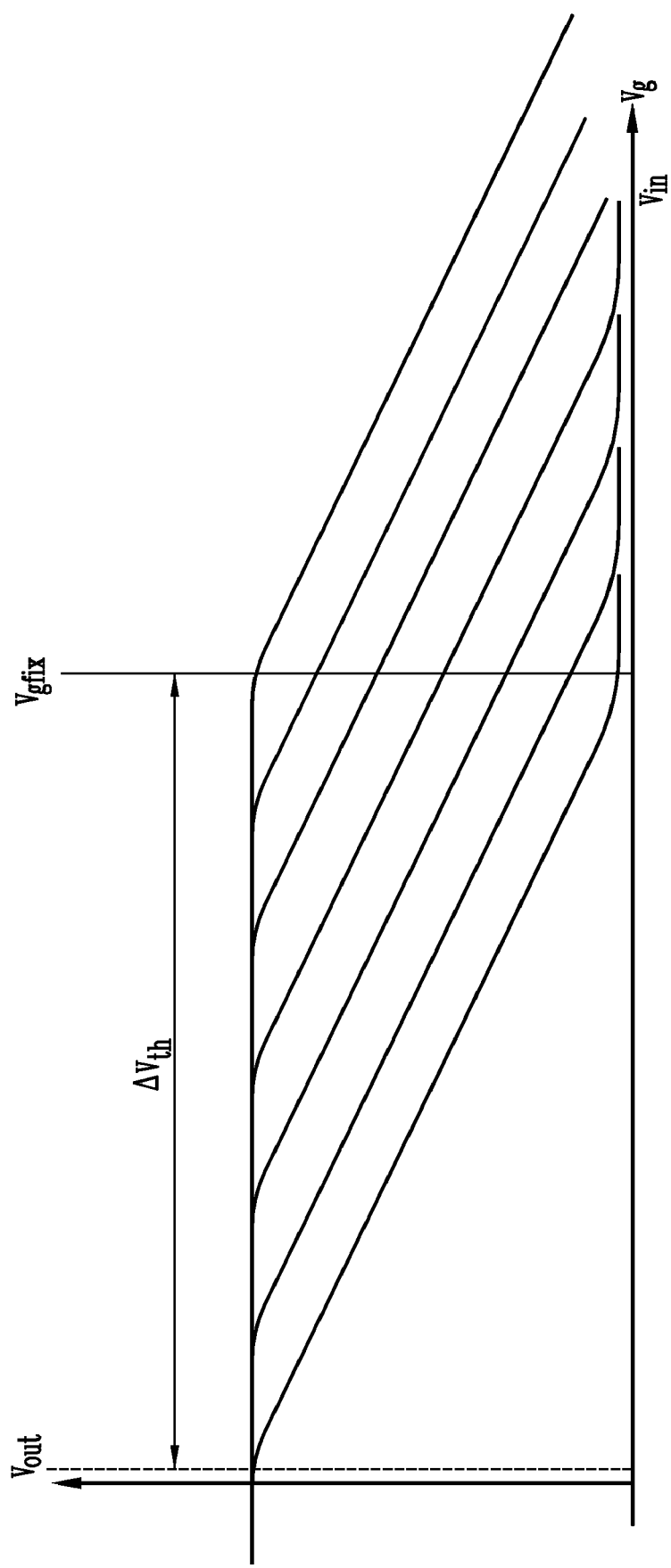

FIG. 7b shows the voltage characteristics of a MOSFET with a low resistance load and high fixed gate voltage in the conventional design. To have a wider non-degenerated threshold voltage range $\Delta V_{th}$ (i.e. the intercepted output voltage $V_{out}$ is not either $V_{dd}$ or zero), the higher $V_{gfix}$ line (vertical line to the further right) and less steep slopes are desirable.

FIGS. 8(a), 8(b), 8(c), 8(d) and 8(e) show various load devices used with N-channel MOSFETs in non-volatile memory cells of the type usable with this invention.

FIGS. 9(a), 9(b), 9(c), 9(d) and 9(e) show various load devices used with P-channel MOSFETs in non-volatile memory cells of the type usable with this invention.

FIG. 10 shows a CMOS structure usable as part of a non-volatile memory cell in association with this invention.

Figure 11:
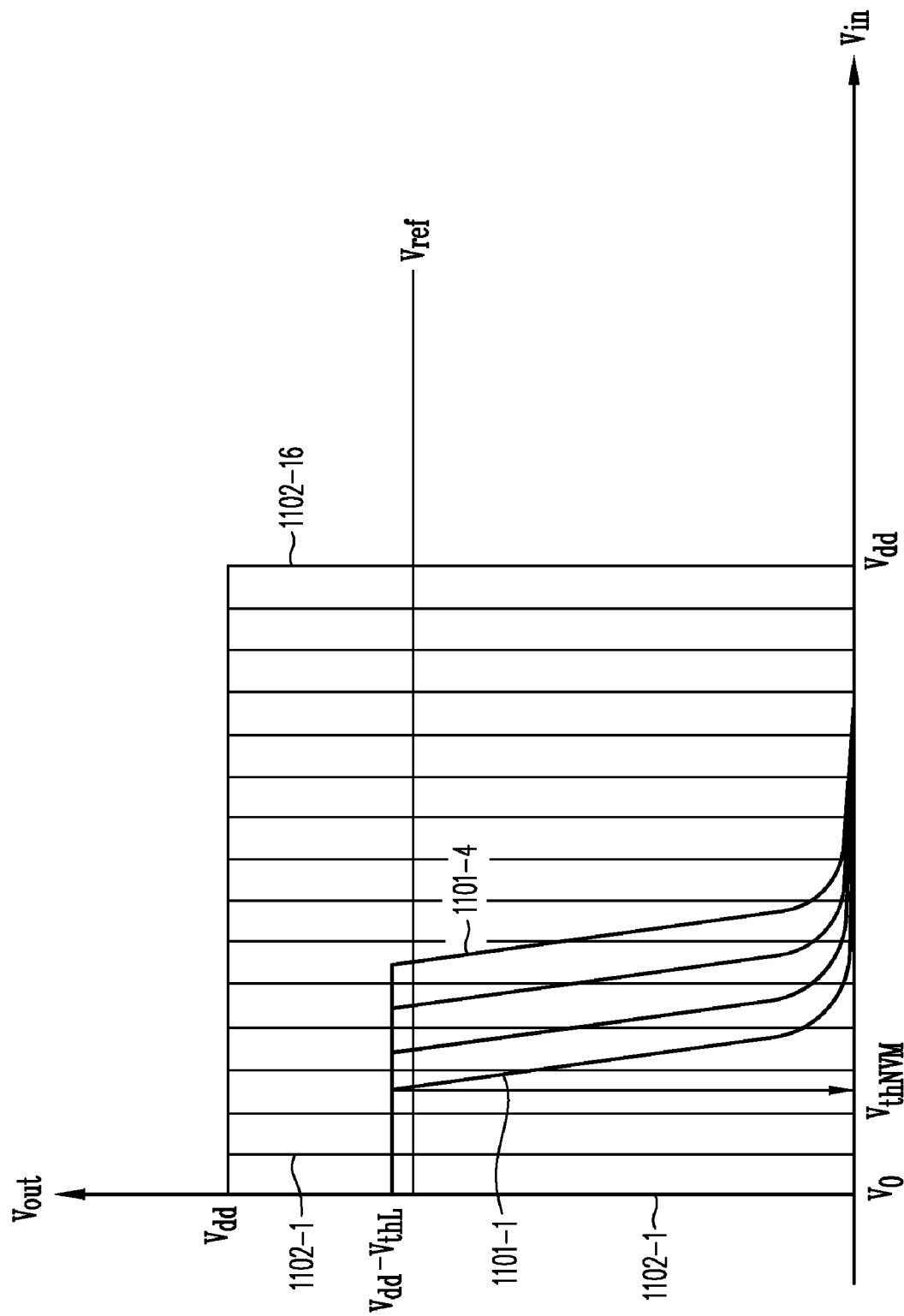

FIG. 11 shows the relationship of the output voltage $V_{out}$ from an NMOSFET used in a non-volatile memory cell with a diode-connected MOSFET load (FIG. 8b or FIG. 8c) as a function of the threshold voltage $V_{th}$ of the non-volatile memory cell transistor in relation to a reference voltage $V_{ref}$.

Figure 12:
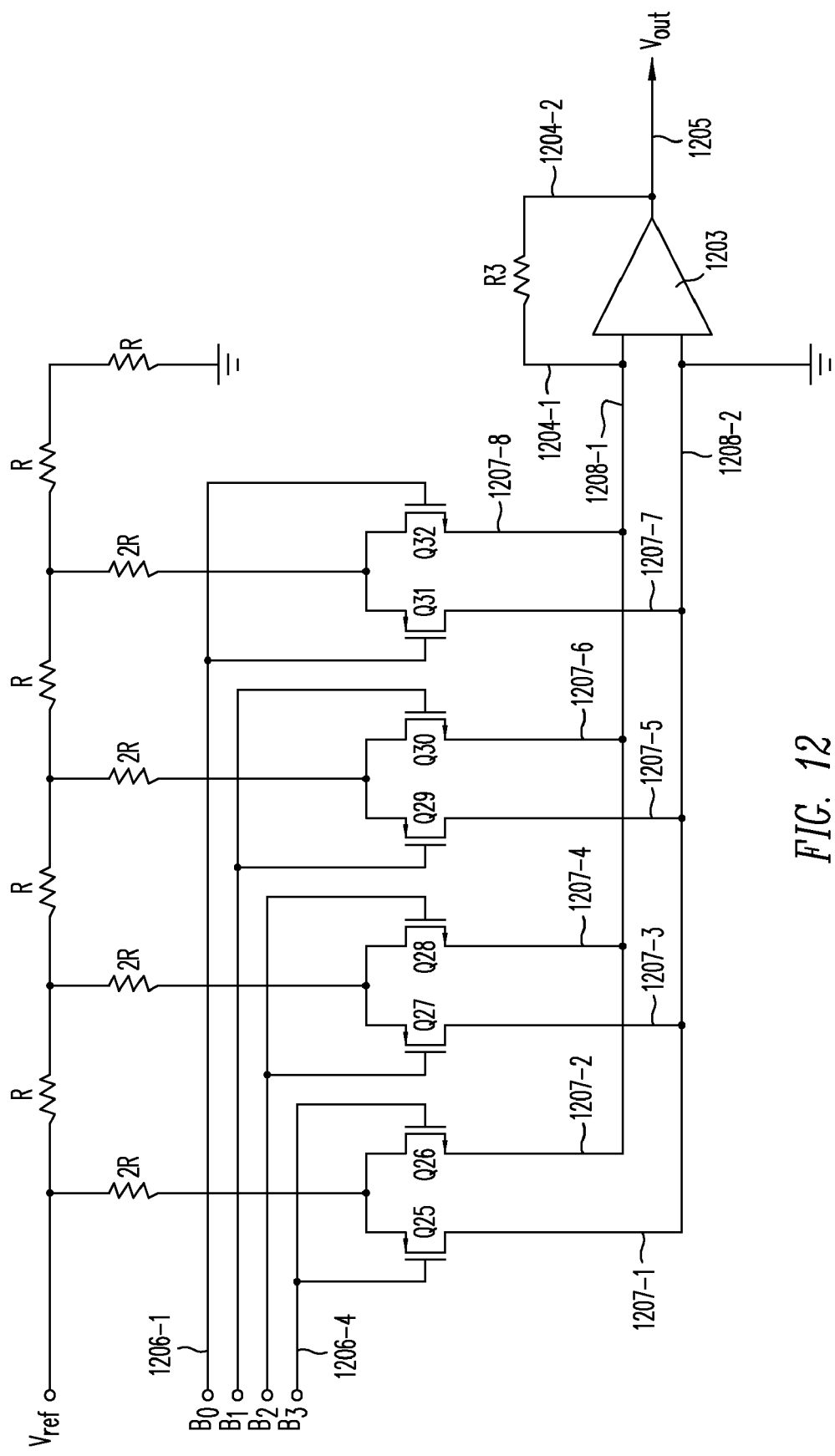

FIG. 12 shows a typical R2R digital-to analog circuitry for generating a stepped voltage from a four-bit digital signal.

Figure 13:
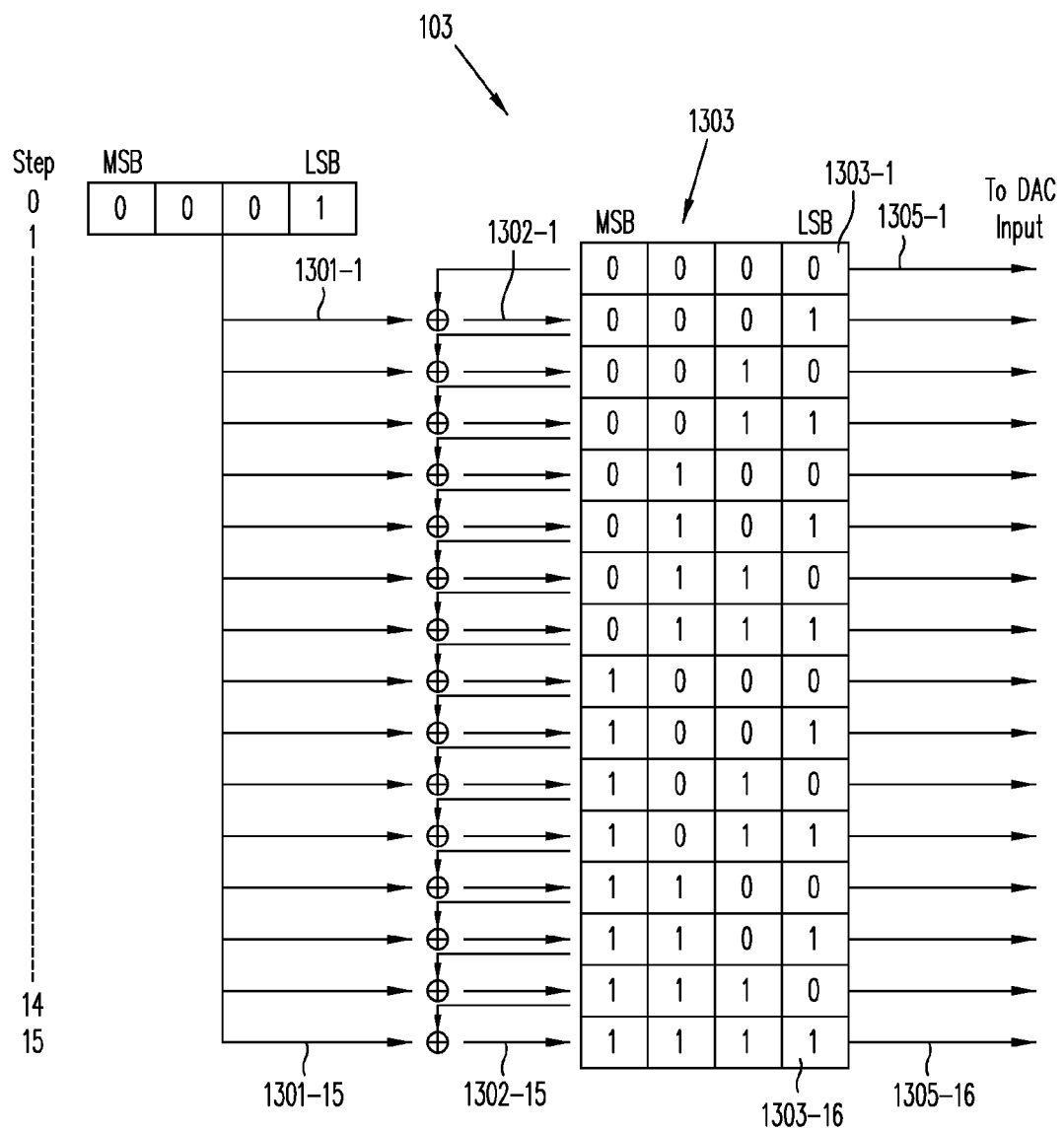

FIG. 13 shows using an adder to generate a lookup table of a type of bit pattern generator associated with this invention for reading out a four-bit digital code word corresponding to any one of 16 different voltage levels.

Figure 14:
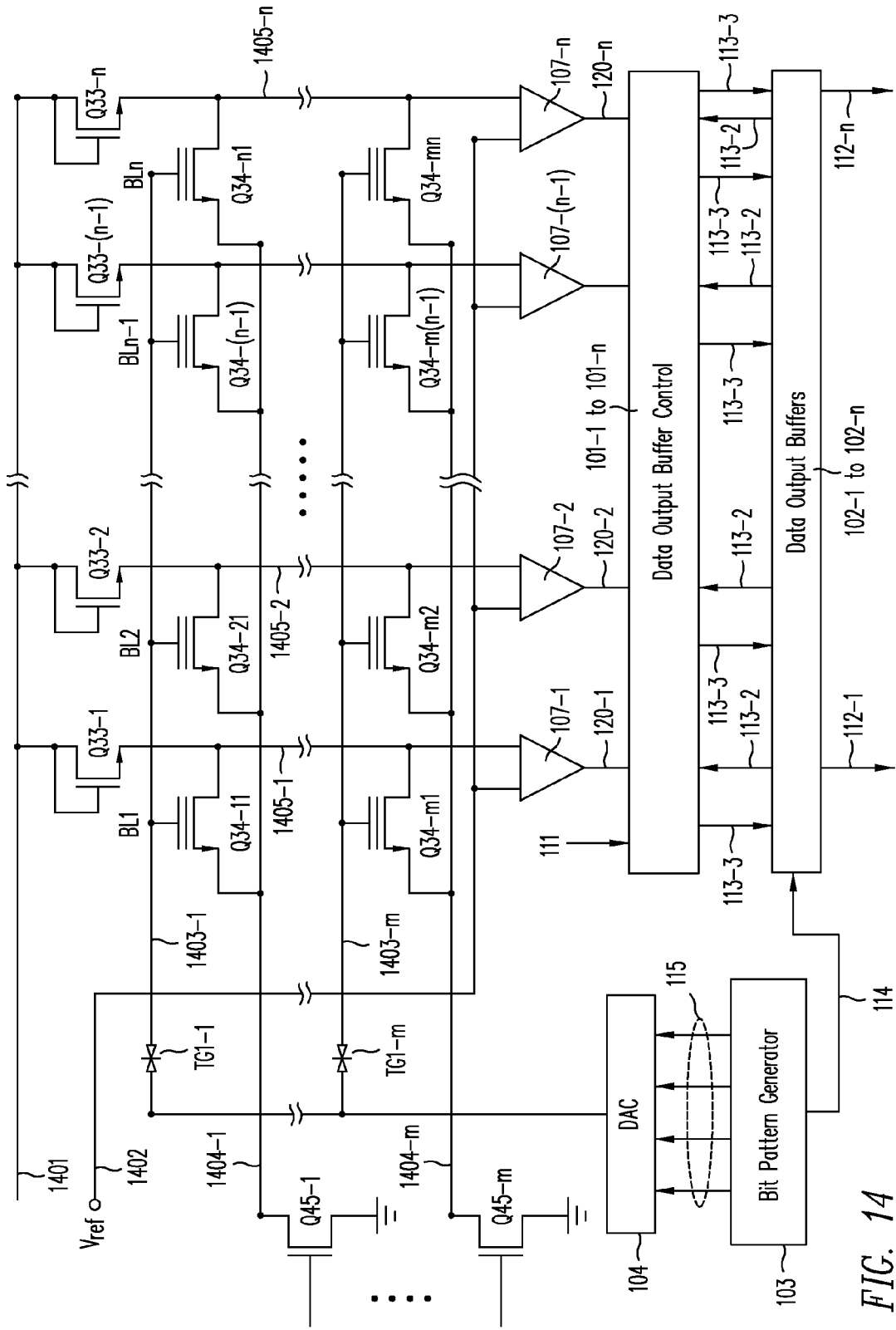

FIG. 14 shows a non-volatile memory cell array suitable for use with this invention.

Figure 15:
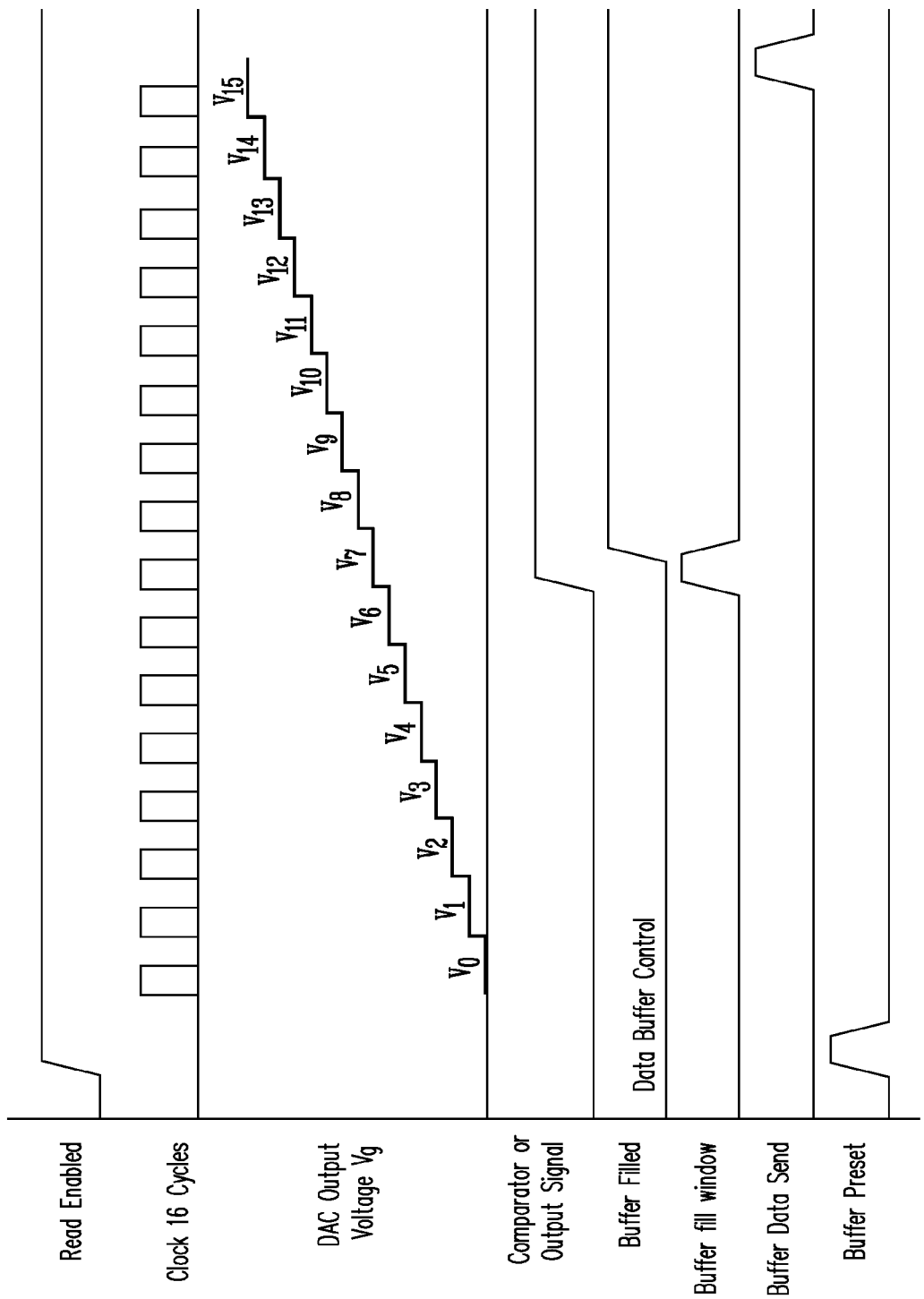

FIG. 15 illustrates waveforms associated with the circuitry such as shown in FIGS. 1, 2, 3 and 13 for applying different voltage levels to the control gate of a non-volatile memory cell.

DETAILED DESCRIPTION

The following detailed description is meant to be illustrative only and not limiting. Other embodiments of this invention will be obvious to those skilled in the art in view of the following description.

FIGS. 1, 2 and 3 show, respectively, embodiments of this invention using an N-type MOSFET non-volatile memory cell, a P-type MOSFET non-volatile memory cell and a complementary MOSFET non-volatile memory cell. In FIGS. 1, 2 and 3, a bit pattern generator 103 generates digital bits to be input to a digital-to-analog converter 104 to generate an analog control voltage to be applied on lead 116 to the control gate of at least one transistor in a non-volatile memory cell. Thus, in FIG. 1, N-channel MOSFET Q1 has a floating gate 124 on which electrical charge corresponding to any one of N voltage levels can be stored together with a control gate 125 to which will be applied a control voltage from DAC 104 for reading out the particular multi-bit information stored as an electrical charge on floating gate 124. Control gate 125 is connected to the output lead 116 from digital-to-analog converter 104. A bit pattern generator 103 sends N different digital words on buses 115 to DAC 104. In one embodiment, the number of buses 115 corresponds to the number of different voltage levels, which can be stored on floating gate 124 of N-channel MOSFET Q1. In this embodiment, if sixteen (16) voltage levels can be stored on floating gate 124, each bus has four leads to transmit four bits in parallel to DAC 104. If the bits representing a given voltage level are transmitted in series each bus can be a single lead.

Bit channel pattern generator 103 provides bits not only to digital-to-analog converter 104 on bus 115 but also to data output buffer 102 on buses 114. Data output buffer 102 is controlled by data output buffer control 101. Buffer control 101 receives an input signal on lead 121 from the output terminal 120 of comparator 107 which produces a change in output signal level on output lead 120 in response to MOSFET Q1 changing its state in response to a control voltage being applied to control gate 125 which turns on N-channel MOSFET Q1. The output signal change on lead 121 is detected by data output buffer control 101 which in turn sends a signal on receiving enable lead 113-3 to enable data output buffer 102 to receive the bit word from bit pattern generator 103 on a selected one of buses 114. After the data buffer 102 for the specific memory cell is occupied, it may send an occupied data buffer signal to data buffer controller 101 by the lead 113-2 to prevent overwriting data buffer 102 in a later cycle. After completing the whole cycle for interrogating all N possible bit words, a "send" signal from the buffer controller 101 on bus 113-1 enables the data buffer to send out the entire buffered datum in the data buffer 102 on output terminal or bus 112.

As shown in FIG. 13, bit pattern generator 103 is driven by a clock signal (clock not shown) to provide in sequence an output signal on each of buses 1305-1 to 1305-16 from lookup table 1303 corresponding to the bits stored in 16 different registers 1303-1 to 1303-16 of four bits each. Digital-to-analog converter 104 (FIGS. 1, 2, and 3) provides on output lead 116 to control gate 125, 225, or 325. a sequence of voltage levels as shown in the third line of FIG. 15 ranging from $V_0$ to $V_{15}$. The particular voltage level $V_g$, which corresponds to the threshold voltage $V_{th}$ of N-channel MOS transistor Q1 (FIG. 1), then turns on transistor Q1. Appropriate ramped voltages applied to the control gates 225 or 325 of P-channel transistor Q2 (FIG. 2), or CMOS transistors Q3 and Q4, respectively, will turn on Q2 or CMOS transistors Q3 and Q4 when the voltage applied to the control gate 225 or 325 corresponds to the threshold voltage of these transistors. The particular bits from the corresponding register 1303-$i$ in FIG. 13 which correspond to the threshold voltage $V_{th}$ are then read out of bit pattern generator 103 (FIGS. 1, 2 and 3) on a corresponding one of buses 114 to data output buffer 102. Buffer 102 provides on lead 112 (which might also be an n-channel bus if the signal from buffer 102 is n bits in parallel) a signal corresponding to the voltage level stored on floating gate 124, 224 or 324 of the transistor or transistors in the non-volatile memory cell.

For the sequence in FIG. 13, data output control 101 is preset by a signal on lead 111 from the system controller (not shown) to clear the leftover datum in the data buffer 102 before starting a new interrogating cycle. A sending enable signal on lead 113-1 is sent from data output buffer control 101 to the data buffer in the end of the interrogating cycle to send out the buffered datum. This signal enables buffer 102 to output on lead 112 the digital signal which represents the information stored on the floating gate of the corresponding transistor or transistors in the NVM cells. A voltage change on lead 121 reflects a change in the output signal from comparator 107 on lead 120 indicating the turning on of transistor Q1 (or Q2 or Q3 and Q4) by a selected voltage on output lead 116 from digital-to-analog converter 104.

In summary, the output signals from the digital-to-analog converter 104 are a series of discrete voltages corresponding to the multi-bit input signals from bit pattern generator 103. Each discrete output voltage from digital-to-analog converter 104 is applied in FIG. 1 to the control gate 125 of N-channel MOSFET Q1. Transistor Q1 is being interrogated so that the information stored as an electrical charge on floating gate 124 can be determined. Each discrete voltage applied to control gate 125 corresponds to one particular combination of bits applied to one of the input buses 115 of digital-to-analog converter 104. The output voltage of the circuit comprising load 105 and N-channel MOSFET Q1 series-connected between the supply voltage $V_{dd}$ and ground is transmitted on lead 118 to comparator 107. Reference voltage $V_{ref}$ is applied to input terminal 119 of comparator 107. The output voltage on terminal 120 of the comparator 107 will, in one embodiment, be either a one (1) for supply voltage $V_{dd}$ on lead 118 or a zero (0) for ground voltage on lead 118, respectively. The two output voltage states of the comparator 107 correspond to output voltages of the non-volatile memory cell being greater or less than the reference voltage $V_{ref}$ on input lead 119. Depending on the circuit design, the output voltage states of comparator 107 can be reversed, if desired.

The output voltage on terminal 120 from comparator 107 is transmitted to data output buffer control 101 on lead 121. A change in this output voltage on terminal 120 causes data output buffer control 101 to trigger data output buffer 102 to receive the digital bits from bit pattern generator 103 (corresponding to the bits stored on floating gate 124) to output lead or bus 112 and from there to the system for use in the system.

In FIG. 1, the voltage on input lead 118 to comparator 107 is high, corresponding essentially to $V_{dd}$, until N-channel MOSFET Q1 turns on and pulls the voltage on lead 118 to ground. Thus, the voltage on lead 118 will initially be above the reference voltage on input lead 119 to comparator 107 and will drop below this reference voltage when transistor Q1 turns on.

The structure shown in FIG. 2 works as shown in FIG. 1, except that current load 105 (FIG. 1) in series between terminal 117 from $V_{dd}$ to N-channel MOSFET Q1 is replaced in FIG. 2 by a current sink 206 between the drain of P channel MOSFET Q2 and ground. In FIG. 2, the source of MOS transistor Q2 is connected to $V_{dd}$.

In FIG. 2, the voltage on input lead 218 to comparator 107 will remain low, close to ground due to the action of current sink 206 until transistor Q2 turns on. When transistor Q2 turns on, the voltage on lead 218 will be pulled high toward voltage $V_{dd}$ as applied to the source of P-channel MOS transistor Q2 through lead 117. Otherwise, the structure of FIG. 2 operates in a similar manner to the structure of FIG. 1 except that the voltage applied to control gate 225 ramps in a negative direction (start voltage from $V_{dd}$ to ground direction) rather than a positive direction (start voltage from ground to $V_{dd}$ direction). Note that the gate voltage required to turn on p-channel MOS transistor is below $V_s - V_{thp}$ ($V_{thp} > 0$), where $V_s$ is the applied source voltage and $V_{thp}$ is the absolute value of the threshold voltage for the p-channel MOS transistor. Electrons stored on floating gate 224 shift $V_{thp}$ to a smaller value. Thus, the required gate voltage to turn off P-channel MOSFET is larger ($V_g > V_s - V_{thp}$ for turning-off) than it would be if no electrons were stored on the floating gate.

The structure of FIG. 3 likewise operates in the same manner as the structure in FIGS. 2 and 1 with the exception that transistors Q3 and Q4 are essentially P-channel and N-channel MOSFETs, respectively, connected in series to operate as a CMOS device. In one embodiment, when the voltage level applied to control gate 325 in FIG. 3 is low, N-channel transistor Q4 is off and P-channel transistor Q3 is on. Thus, the voltage on lead 318 is high. As the voltage output from digital-to-analog converter 104 increases and is applied to control gate 325, at some point, P channel transistor Q3 turns off depending on the charge stored on the common floating gate 324, the capacitance between control gate 325 and the common floating gate 324, the donor impurity concentrations in both channels, and the P-channel and N-channel capacitive coupling ratios. In response to this voltage or some other higher voltage depending on the charge stored in the common floating gate 324, the capacitance between control gate 325 and the common floating gate 324, the donor impurity concentrations in both channels, and the P-channel and N-channel capacitive coupling ratios, N-channel transistor Q4 turns on. At this time, the voltage on input lead 318 to comparator 107 changes from a high level voltage corresponding to or near $V_{dd}$ to a low level voltage corresponding to ground. At this point, the change in value of the output signal from output terminal 120 of comparator 107 is transmitted on lead 121 to data output buffer control 101 indicating that the output signal on lead 120 from comparator 107 has gone from a high level to a low level. This causes data output buffer control 101 to operate in a manner described above in conjunction with FIG. 1 to allow the particular bit pattern in bit pattern generator 103 which generated this change in output voltage from comparator 107 to be transmitted through data output buffer 102 to the output lead 112.

The input voltage and output voltage of the transistor or transistors in a non-volatile memory cell such as N-channel MOS transistor Q1 (FIG. 1), P-channel MOS transistor Q2 (FIG. 2), and P-channel MOS transistor Q3 connected in series with N-channel MOS transistor Q4 to form a CMOS structure (FIG. 3), is characterized by an inverter-type of voltage transfer characteristic ("VTC") as shown in FIG. 4. The input voltage $V_{in}$ is the voltage on the control gate of the MOS transistor Q1, Q2 or Q3 and Q4. The output voltage $V_{out}$ is the voltage at node between Q1 and load 105, or the node between Q2 and current sink 206 or at the node between Q3 and Q4. The shapes of the VTC curves depend on the NVM cell threshold voltage and the NVM cell drive current in relation to the load. In general, the output voltage begins to invert from a high level voltage to a low level voltage for the upper portion of the VTC curves immediately after the voltage applied to the control gate 125 (FIG. 1) and 325 (FIG. 3) of the corresponding NMOS transistor begins turning on the NVM cell. Turning off the corresponding PMOS transistor by applying voltage to the control gate 225 (FIG. 2) and 325 (FIG. 3) is more prominent near the lower portion of the VTC curves.

As shown in FIG. 4 the slope of the curve can vary from a very steep slope as shown with the VTC characteristic curve 401-1, to a curve such as 401-6 which also has a fairly steep slope showing a very rapid transition of the circuit from a high output voltage to a low output voltage, to the curve such as shown in 401-7, with a more gradual slope which represents a smaller load connected in series with the NVM cell. The curves showing the voltage transfer characteristics for voltages between those which generate VTC 401-1 and VTC 401-6 have not been numbered to avoid cluttering the drawing but will be obvious to those skilled in the art to be 401-2 through 401-5. The curves 401-2 through 401-5 have different slopes depending on the characteristics of the load connected in series with the MOS transistor in the NVM memory cell. Generally, the higher the load resistance, the steeper the voltage transition. Also, the larger the drive current through the MOS transistor, the steeper the voltage transition.

Current response to a voltage applied to the control gate of an NVM cell after turning on fully depends upon the voltage difference between the voltage applied to the control gate and the threshold voltage of the NVM cell. Explicitly, the drive current of a MOSFET is given by $$I_d = k[(V_g - V_{th}) \times V_{ds} - \tfrac{1}{2} V_{ds}^2] \tag{2}$$

in the linear region or $$I_d = k/2(V_g - V_{th})^2 \times (1 + \lambda V_{ds}) \tag{3}$$

in the saturation region.

In equations (1) and (2), k is a constant, $V_g$ is the voltage applied to the control gate, $V_{th}$ is the threshold voltage of the MOSFET in the NVM memory cell, $V_{ds}$ is the drain to source voltage, and $\lambda$ is the channel length modulation parameter. The drive current is always a function of $(V_g - V_{th})$.

In the NVM cell, the threshold voltage is given by $$V_{thnvm} = V_{th0} - Q_f/C_c \tag{4}$$

where $V_{th0}$ is the threshold voltage for the MOSFET in the NVM cell with no charge stored on the floating gate, $Q_f$ is the charge stored on the floating gate (negative for electrons and positive for holes) and $C_c$ is the capacitance between the control gate and the floating gate. Electrical response from a non-volatile memory cell is always a function of $(V_g-V_{thnvm})$. With different charges on the floating gate leading to different threshold voltages, the electrical response to the voltage supplied to the control gate of the non-volatile memory cell is always shifted by $-Q_f/C_c$. Therefore the VTC curves for the NVM cells with different threshold voltages are always parallel shifted by $-Q_f/C_c$ along the input voltage axis. If the floating gate has stored electron charge (negative) leading to a positive threshold voltage shift, the VTC curve shifts toward the right from the curve with the original threshold voltage of the NVM. Positive charge (holes) stored in the floating gate causes the VTC curve to move toward the left from the curve with the original threshold voltage.

Figure 5:
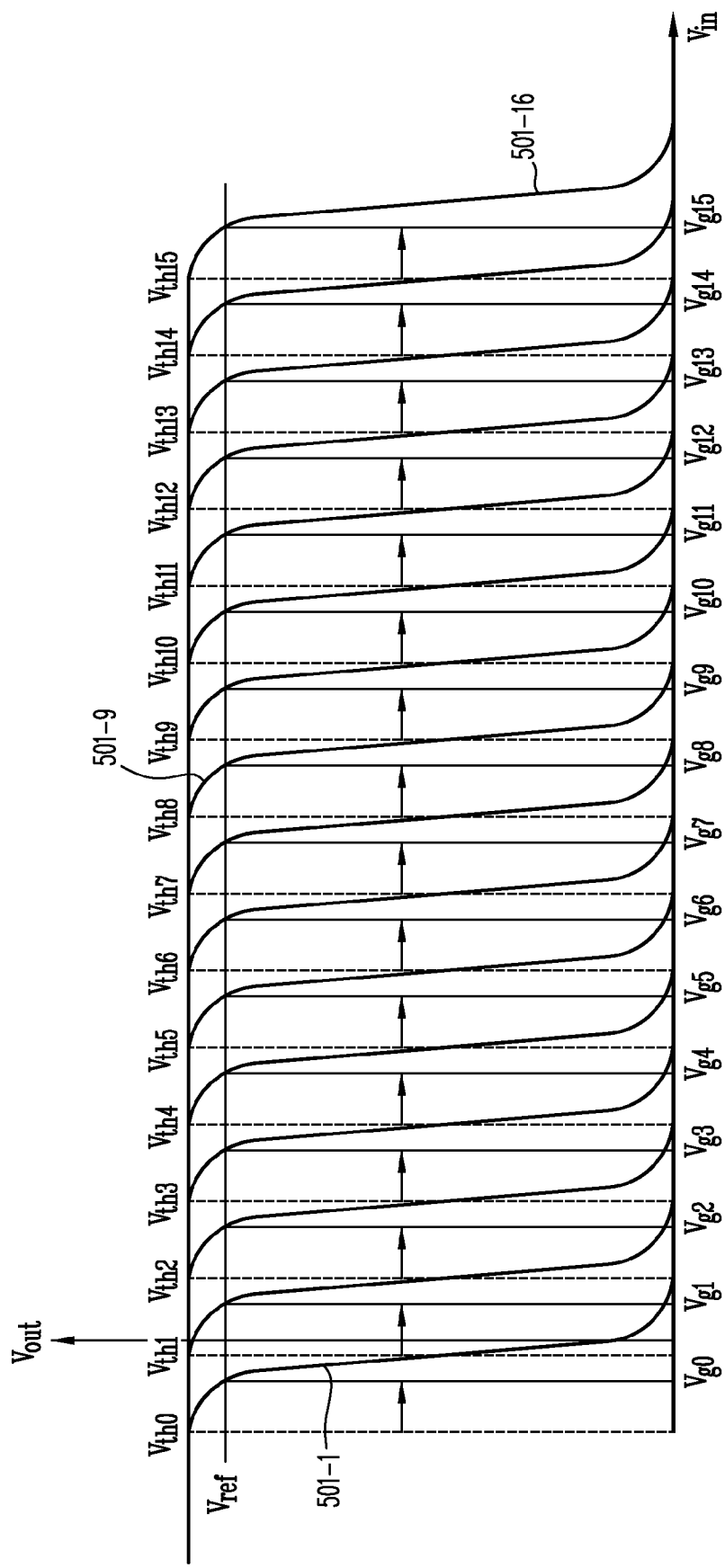
FIG. 5 shows the one-to-one correspondent gate voltage $V_{gi}$ for output voltage $V_{out}$.

FIG. 5 shows that at the same output voltage $V_{out}$ represented by a horizontal line cutting through the parallel VTC curves associated with the different threshold voltages $V_{thi}$ for the MOS transistor associated with the NVM cell, the input gate voltage $V_{gi}$ with the corresponding output voltage being the reference voltage $V_{ref}$ has a one-to-one correspondence to the NVM threshold voltage. The threshold voltage $V_{thi}$ with charge $Q_{fi}$ on the floating gate is related to the threshold voltage $V_{th0}$ with no charge on the floating gate by Equation 5.

$$V_{thi}=V_{th0}-Q_{fi}/C_c \quad (5)$$

In Equation 5, $C_c$ is the capacitance between the control gate and the floating gate. $Q_{fi}$, the charge on the floating gate (such as floating gate 124 (FIG. 1), 224 (FIG. 2), 324 (FIG. 3)), corresponds to a particular one of N different possible threshold values. Thus, the amount of charge $Q_{fi}$ necessary to correspond to a threshold voltage of $V_{thi}$ can be calculated based upon equation (5).

FIG. 6a shows the threshold voltage distribution for an NVM cell for a threshold voltage level $V_{thi}$ after programming. As shown in FIG. 6a, this threshold voltage distribution can be uniquely transformed into the gate voltage distribution (dotted line) at $V_{gi}$ with the output voltage coinciding with the reference voltage $V_{ref}$, where $V_{gi}$ is the voltage applied to the control gate 125 (FIG. 1), 225 (FIG. 2) or 325 (FIG. 3) of the MOSFET in the NVM memory cell as shown in any one of FIG. 1, 2 or 3. The transformation is done by mapping the threshold distribution from $V_{thi}$ into $V_{gi}$ by intercepting the horizontal line $V_{ref}$ with a bunch of VTC curves with threshold voltage distribution around $V_{thi}$.

The distribution 601-1 represents the threshold voltage distribution at the threshold voltage level $V_{th0}$ after programming which will correspond to a gate voltage $V_{g0}$ the distribution of which is shown by plot 601-1a with the output voltage coinciding with the reference voltage $V_{ref}$. The curves made up of the dots, such as curves 601-1a to 601-16a, represent the distribution for the applied gate voltages $V_{g0}$ to $V_{g15}$ to obtain the output voltage coinciding with the reference voltage $V_{ref}$ for the threshold voltage distributions $V_{th0}$ to $V_{th15}$ (shown as the solid lines 601-1 to 601-16).

Having the one-to-one correspondent distribution between $V_{thi}$ and $V_{gi}$, we may omit the threshold voltage distributions (solid line) in FIG. 6a and keep the corresponding gate voltage distributions (dotted line) shown in FIG. 6a and add the VTC characteristic 602-i at $V_{gi}$ associated with the threshold voltage $V_{thi}$ to FIG. 6b. As shown in FIG. 6b, if the voltage step $V_0$ to $V_{15}$ to be applied to the control gate of the NVM cells is chosen such that the entire corresponding gate voltage distribution at $V_{gi}$ (dotted line) is between the step voltage $V_{i-1}$ and $V_i$ for every i=0, 1, 2 . . . , 15, then when the applied control gate voltage increases from $V_{i-1}$ to $V_i$ the output voltage responses for the entire population of the MOFET memory cells having the threshold voltage distribution at threshold voltage level $V_{thi}$ invert from greater to less than the reference voltage $V_{ref}$. Thus the output voltage from comparator 107 in FIGS. 1, 2, and 3 will change in value when the applied control gate voltage increases from $V_{i-1}$ to $V_i$ for a threshold voltage $V_{thi}$. As shown in FIG. 6b, the voltage distribution of gate voltage $V_{gi}$ is required to be peaked between the output voltages on lead/bus 112 corresponding to $V_{i-1}$ and $V_i$. The threshold voltage distribution for a specific threshold voltage level $V_{thi}$ in the NVM cells after programming must be peaked at this level. The multiple bits at the input leads to the digital-to-analog converter 104 (FIGS. 1, 2 and 3) can be correlated to represent this threshold voltage level.

To obtain the maximum inverter gain for a typical VTC to drive the comparator logic circuit 107, the reference voltage applied to input terminal 119 of comparator 107 may be set to a voltage corresponding to the maximum absolute value of the derivative of the VTC curve. This ensures that the comparator and sensing circuits always operate in the most sensitive region of NVM cell regardless of the threshold voltage level of the NVM cell. Thus, in an array of such cells, all the NVM cells would be set to operate in their most sensitive regions regardless of their threshold voltage levels.

The scanning input voltages to the control gate 125 (FIG. 1), 225 (FIG. 2), 325 (FIG. 3)) can also be extended to the full range along the horizontal axis as shown in FIG. 7a. To illustrate this point, we assume a fixed voltage $V_{gfix}$ is applied to an NVM cell with the same type of current load. To obtain the output response voltage, the VTC curves need to intercept with the vertical line $V_{gfix}$. The most likely output voltages are either $V_{dd}$ or ground voltage (considered to be "degenerate" voltages). The only non-degenerated VTC curves are those with threshold voltages within the window $\Delta V_{th}$. Comparing this threshold voltage window with the threshold voltage $V_{thi}$ in full range of the scanning voltage, the result is obvious. Usually, to have a wider threshold voltage window $\Delta V_{th}$ in the conventional sense and readout design, a higher fixed gate voltage and low resistance load are desirable as shown in FIG. 7b. However, the tradeoff to a higher fixed gate voltage and higher current from low resistance load is the reliability associated with data retention, write-erase cycling, and neighbor cell disturbance. Operating in the most sensitive regions of the NVM, means that more threshold voltage levels can be resolved in the present invention than in the prior art.

In FIG. 7b, generally, for preventing the response voltage degeneracy which results from having the transistor in the NVM memory cell operate in its cutoff or saturation region, with a fixed gate voltage in the conventional schemes, loads or sinks connected to the MOSFET in the NVM cell are usually designed to be low impedance to reduce the absolute value of slope of the VTC curve. Thus, such a curve would correspond to the less steep curve 401-7 shown in FIG. 4 or the less steep curves shown in FIG. 7b. That is, the design goal to prevent degeneracy for the conventional scheme is to have wider range of parallel VTC curves to intercept the vertical line at the fix gate voltage $V_{gfix}$ with output voltage neither $V_{dd}$ nor zero.

A current mirror circuit will amplify the current flowing through the load and memory cell depending on the magnitude of the output voltage at the node between load (sink) and memory cell. Such a current mirror amplifies the small response current of the cell. The amplified current is then fed into a differential amplifier and compared with the reference current. The differential amplifier then converts the comparison into a voltage decision (i.e. either a high or a low output voltage from the comparator). Compared with this conventional scheme, this invention further simplifies the amplification scheme and increases the ability of a single NVM cell to store n bits, such as four.

FIG. 8 shows the various current loads which can be used in series with an N-type NVM cell as shown in FIG. 1. In FIG. 8(a) N-channel MOSFET Q4 has series connected resistor R1 connected into a node 801-1 from which the output voltage is taken.

Figure 8E:
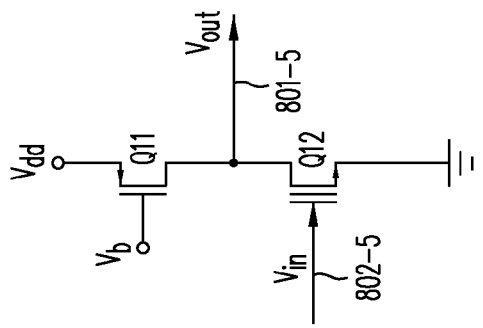
Figure 8D:
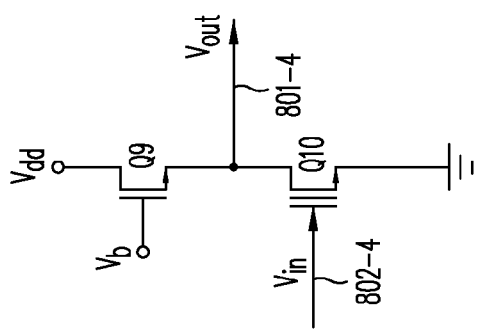
Figure 8C:
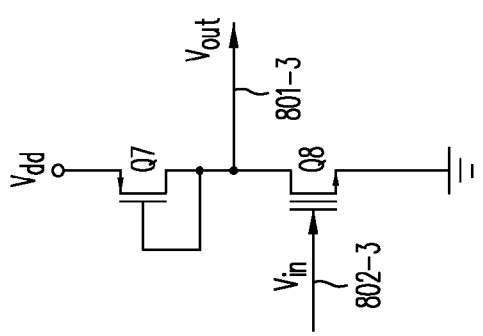
Figure 8B:
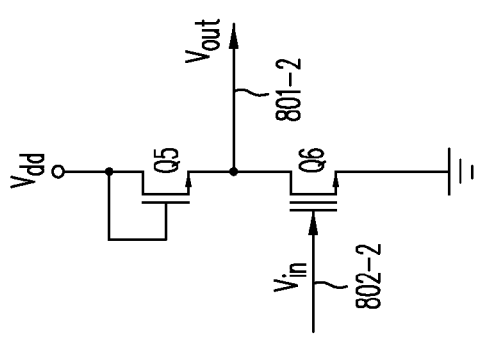
Figure 8A:
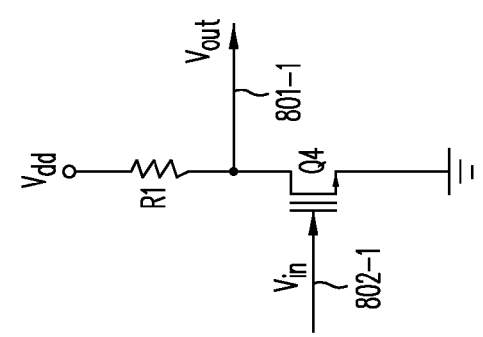

In FIG. 8(b) N-channel MOSFET Q6, with an input voltage to be applied on lead 802-2 to its control gate, is connected in series with N-type saturated transistor Q5. The output voltage is taken again on lead 801-2 connected between the load transistor Q5 and N-channel MOSFET Q6.

FIG. 8(c) shows N-channel MOSFET Q8 with a P-type transistor Q7 saturated load connected in series between $V_{dd}$ and Q8. The output voltage is taken on lead 801-3 from the node between transistor Q7 and transistor Q8.

FIG. 8(d) shows an N-channel MOSFET Q10 with an input voltage to be applied to the control gate of Q10 on lead 802-4, connected in series with N-type linear transistor Q9, to provide a load. The output voltage from the series connected transistors Q9 and Q10 is taken from output lead 801-4 connected to the node between Q9 and Q10.

FIG. 8(e) shows N-channel MOSFET Q12 with the input voltage to be applied to its control gate on lead 802-5, connected in series with a P channel load MOS field effect transistor Q11 connected to operate in its linear region. The output signal from this particular configuration is taken on lead 801-5 connected to the node between transistor Q11 and transistor Q12. Those skilled in the art will recognize that other types of loads can be employed in other embodiments of this invention and variations of the structure shown in FIGS. (8a) to (8e) will be known to those skilled in this art in view of this disclosure.

FIGS. 9(a) through 9(e) show various embodiments of this invention utilizing a P-type MOSFET NVM cell with different types of loads.

FIG. 9(a) shows P-type transistor Q14 connected in series with a resistive load R2. The output voltage from this configuration is taken on output terminal 901-1 connected at the node between transistor Q14 and resistor R2. The other terminal of resistor R2 is grounded. Input voltage to the control gate of P-type MOSFET Q14 is applied on lead 902-1.

FIG. 9(b) shows P-type MOSFET Q15 connected in series with saturated N-type transistor Q16 connected as a load. The source of transistor Q16 is connected to ground with its drain connected to a node which in turn is connected to output lead 901-2 where the output voltage from this configuration is obtained. The control gate of P-type MOSFET Q15 is driven by a voltage on input lead 902-2.

FIG. 9(c) shows P-type MOSFET Q17 connected in series between $V_{dd}$ and the source of P-type saturated MOSFET Q18 connected as a load. The output voltage from this configuration is taken on lead 901-3 connected to the node between Q17 and Q18. The control gate of Q17 receives a voltage on input lead 902-3. The drain of Q18 is grounded.

FIG. 9(d) shows a P-type MOSFET Q19 connected between $V_{dd}$ and the drain of N-type linear transistor Q20 acting as a load. The output voltage from this configuration is taken from lead 901-4 connected to a node between Q19 and Q20. The source of Q20 is grounded and the control gate of Q19 receives a voltage from input lead 902-4.

FIG. 9(e) shows a P-type MOSFET Q21 connected in series between $V_{dd}$ and P-channel linear transistor Q22 which in turn is connected to ground. The source of P-channel transistor Q22 is connected to the output lead 901-5 which in turn is also connected to the drain of P-type MOSFET Q21. Control gate Q21 receives an input voltage from input lead 902-5.

The structures shown in FIGS. 9(a) to 9(e) again illustrate certain embodiments of this invention operating in connection with a P-type NVM transistor such as Q14, Q15, Q17, Q19 or Q21.

FIG. 10 shows one embodiment of the invention utilizing a complementary MOSFET NVM cell made up of series connected P-type MOSFET Q23 and N-type MOSFET Q24. The control gate 1025 is common to both transistors and is driven by the voltage on input lead 1002. The output voltage is taken from a node between the drains of the two transistors Q23 and Q24 on output lead 1001. The source of P-type transistor Q23 is connected to $V_{dd}$ and the source of N-type transistor Q24 is connected to ground. Floating gate 1024, common to both transistors, is capable of storing a selected charge.

FIG. 11 shows typical VTC curves for a saturated transistor loading in series with an N-type non-volatile memory cell MOSFET. When the applied control gate voltage is below the NVM threshold voltage $V_{thnvm}$, the NVM N-type MOSFET is in the cutoff mode. The output voltage for the NVM cell cutting off is $V_{dd}-V_{thL}$ for saturation transistor load or below $V_{dd}-V_{thL}$ for N-type transistor load due to substrate bias effect where $V_{thL}$ is the load transistor threshold voltage. The slope of the VTC curve transition region is given by the negative of the square root of $k_n/k_l$ where $k_n$ and $k_l$ are proportional to the carrier mobility (electrons for N-type MOSEFET and holes for P-type MOSFET) times the width-to-length ratio and load transistor electron mobility times the width-to-length ratio, respectively. To obtain a steeper slope (larger inverted gain) the $k_n/k_l$ ratio can be increased. Usually this can be easily achieved by adjusting the load transistor width-to-length ratio up or down. The decrease in the load transistor width-to-length ratio gives generally a steeper slope and vice-versa. The referencing voltage for the comparator can be chosen in the constant slope of the VTC transition region as shown in FIG. 11 by the location of the reference voltage line $V_{ref}$.

The threshold voltage levels of the MOSFET used in an NVM cell are evenly divided with the voltage level spacing equal to the applied voltage step. Since the response gate voltages minus the reference output voltage $V_{ref}$ is always a constant voltage difference from the threshold voltages for all parallel VTC curves, one can program the threshold voltage level $V_{thi}$ such that the corresponding control gate voltage $V_{gi}$ is at the center of the voltage step between $V_{i-1}$ and $V_i$. When the voltage applied to the control gate (i.e. the "applied gate voltage") increase from $V_{i-1}$ to $V_i$, the output voltage of the NVM cell MOSFET inverter having the threshold voltage level $V_{thi}$ will shift from an output voltage greater than the reference voltage to an output voltage less than the reference voltage. The result is that the inverter output voltage causes the output voltage of the comparator 107 (FIGS. 1 and 3) to change from "high" to "low" or from "low" to "high" depending on the detailed design of the comparator. The state change in voltage on the comparator output lead 120 is applied to a data buffer control circuit 101 on lead 121 (FIGS. 1 and 3) to trigger the data output buffer 102 to provide the bits from the bit pattern generator 103 through data output buffer 102 to the output lead or bus 112. The multiple bits in the data buffer, which corresponds to the voltage applied to the control gate of the MOSFET NVM cell uniquely represent the threshold voltage level of the NVM cell being read.

The inverter curves shown in FIG. 11 reflect the relationship between $V_{in}$ and $V_{out}$ depending upon the threshold voltage $V_{thnvm}$. The maximum threshold voltage is of course $V_{dd}$ as shown on the abscissa of FIG. 11 whereas when the MOS- FET is off, the output voltage is basically $V_{dd}-V_{thL}$. $V_{thl}$ represents the threshold voltage of the load transistor. As the gate voltage applied to the control gate of the MOSFET NVM increases, at some point the threshold voltage $V_{thnvm}$ of the non-volatile memory cell MOSFET is reached and the output voltage from comparator 107 (FIG. 1) will drop from a high level represented by $V_{dd}-V_{thl}$ to approximately ground as shown by the VTC curves 1101-1 through 1101-4. The various threshold voltages that can be associated with the N-channel non-volatile memory MOSFET such as transistor Q1 (FIG. 1) are shown along the abscissa that is varying from $V_0$ through $V_{dd}$.

FIG. 12 shows an embodiment of a four bit R2R digital-to-analog converter (DAC) in accordance with this invention. Such a converter is of well-known design and can be used for DAC 104 in FIGS. 1, 2 and 3. Note that four input bits $B_0$ through $B_3$ are transmitted in parallel on input leads 1206-1 through 1206-4, respectively, to control the operation of pass transistors Q25 through Q32. These pass transistors (comprising four pairs of parallel-connected transistors, each pair made up of a P-channel and an N-channel transistor connected in parallel) are connected in a well-known manner to allow voltages to be applied to input leads 1208-1 through 1208-2 to differential amplifier 1203 to provide an output voltage on output lead 1205 which will then be used to apply voltage to the control gates 125 (FIG. 1), 225 (FIG. 2) and 325 (FIG. 3). The output voltage from the DAC on output lead 1205 ranges from 0 volts to $V_{dd}$ volts. Each voltage step is given by $V_{dd}/16$. For $V_{dd}$ typically being 3.3 volts, the voltage step is 206.25 millivolts. Therefore, the threshold voltage spacing will be 206.25 millivolts. The operation of the DAC as shown in FIG. 12 is well-known and this will not be described in further detail.

FIG. 13 illustrates a four bit adder for generating a simple digital pattern. The digital pattern generator shown in FIG. 13 can be used in bit pattern generator 103 (FIG. 1) to generate the bits to be driven into DAC 104 and when a match is found with the information stored on the floating gate of the corresponding MOSFET, onto output lead/bus 112 (FIGS. 1, 2, and 3).

In FIG. 13, the initial four bit word starts at "0000". Every clock cycle, the output bits will change by adding "0001" to the previous four bit word. The output bit pattern is shown in the table on the right side of FIG. 13. The table on the right side of FIG. 13 illustrates schematically the bits that will be applied as $B_0$ through $B_3$ in FIG. 12 to the inputs of the DAC 104 (FIGS. 1, 2 and 3).

FIG. 14 shows in schematic form one embodiment for a multi-bit NVM NOR-type m×n array. The array architecture shown in FIG. 14 will be well understood by those skilled in the art in view of the description contained herein. In FIG. 14, word lines 1403-1 through 1403-m each control the current path from the parallel-connected source electrodes of the NVM devices in a corresponding row of NVM cells such as BL1, BL2 to BLn-1, BLn connected to row 1403-1. For example, the source electrodes of the transistors Q34-11 through Q34-n1 are connected to line 1404-1 which in turn is connectable to ground by turning on pass transistor Q45-1. Pass transistor Q45-1 can be either an N-channel or a P-channel device depending upon design considerations. Bit lines 1405-1 through 1405-n connect the drains of transistors in a column to one input of a corresponding one of comparators 107-1 through 107-n. For example, bit line 1405-1 corresponds to lead 118 in FIG. 1. This lead 1405-1 is connected to one input terminal to comparator 107-1. The other input terminal of comparator 107-1 is connected to a voltage reference source by conductive lead 1402.

The output terminal 120-1 from comparator 107-1 is then input to data output buffer control 101-1, corresponding to data output buffer control 101 as shown in FIG. 1. The data output buffer control 101 then operates as described above in conjunction with the description of FIGS. 1 through 3 to provide an output signal on the corresponding output leads 113-2 and 113-3 to the corresponding data output buffer 102-1 in the plurality of such data output buffers 102-1 through 102-n as shown in FIG. 14. Bit pattern generator 103 then will provide the bit pattern to the data output buffer 102-1 to allow this correct bit pattern to be output as a signal on the corresponding output lead 112-1 as described above in conjunction with FIGS. 1 through 3.

In FIG. 14, bit lines 1405-1 to 1405-n connect the drain electrodes of the corresponding N-channel MOSFET Q34 to the appropriate input lead of the corresponding comparator 107.

For example, bit line 1405-1 connects the drains of corresponding N-channel MOSFETs Q34-11 through Q34-m1 where m represents the number of rows, to one input terminal to comparator 107-1. The reference terminal to comparator 107-1 is connected to $V_{ref}$ by lead 1402. Load transistor Q33-1 (a saturated N-channel MOSFET) is connected in series with each of transistors Q34-11 through Q34-m1. A corresponding one of pass transistors Q45-1 through Q45-m is turned on to read out the value stored on the floating gate in the corresponding N-channel MOSFET Q34. The structure then works as described above in conjunction with FIG. 1. The array architecture shown in FIG. 14 allows addressable cell readouts. Thus each cell Q34-11 through Q34-mn can be selectively addressed and read out with all cells in the same row in a manner described above. The output signal on lead 120-i from each comparator 107-i is used to trigger the corresponding data output control circuit 101-i to pass the multi-bits in the bit pattern generator 103 into the corresponding data buffer 102-i preparatory to being read out on the corresponding output terminal 112-i from the circuit. Gates TG1-1 through TG1-m allow only one selected row 1403-i to be enabled at a time, thereby speeding up the readout process by reducing the capacitive loading on DAC 104.

FIG. 15 has waveforms showing how the NVM NOR type n×m array in FIG. 14 functions. Using four bits per single cell as an example to demonstrate the multi-level read operation, in FIG. 15, the top line represents a high level receiving enable signal to go on lead 113-3 from the data output buffer control 101 to the data output buffer 102. The data buffer 102 is pre-set to null as shown in the bottom line. The pre-set signal comes in on terminal 111 (FIGS. 1 and 14) to the data output buffer control 101. A row of NVM cells such as cells Q34-11 through Q34-n1 (FIG. 14) are connected to ground by applying an appropriate voltage to the gate of pass transistor Q45-1. Actually all word lines 1403-1 through 1403-m in the array shown in FIG. 14 could be connected to the output lead of the DAC by turning on the transmission gates TG1-1 to TG1-m simultaneously rather than sequentially, but only a single row is read out at a time by turning on only one pass transistor Q45-i at a time provided that the DAC is capable of charging the gates and the connected word lines rapidly. The 16 cycles of clock are started to drive the bit pattern generator 103 as shown in the second line. The bit pattern generator generates voltages $V_0$ to $V_{15}$ in sequence.

The voltage output level of the digital-to-analog converter 104 is shown in the third line. When the output signal from comparator 107 is set to be "high" as shown in the fourth line, in response to the output voltage from the digital-to-analog converter 104 corresponding to the threshold voltage of the particular N-channel MOSFET Q34-11 being read, then the corresponding data output buffer control circuit 101-1 corresponding to the bit line 1405-1 enables the data buffer 102-1 to receive four bits from the bit pattern generator 103 on bus 114. These four bits are then read out from data buffer 102-1 on output terminal or bus 112-1. Output terminal 112-1 can be a four bit channel if digital signals are to be read out or if a digital-to-analog converter is part of the data output buffer 102-1 can be a single terminal containing an analog voltage corresponding to the value of the four bits from bit pattern generator 114 stored in the MOSFET NVM memory cell Q34-11.

After the data buffer for the particular bit line such as 1405-1 is filled, (see the fifth line from the top of FIG. 15) in response to the signal on the data buffer control going high, then the data buffer control circuit 101-1 disables the filled data buffer 102-1 from getting new data in the sequential clock cycle. The third line from the bottom in FIG. 15 shows the time window of the data buffer 102-1 to receive the four bits of data from the bit pattern generator 103. After all 16 cycles of the DAC output voltage have been completed, the data buffers 102-2 through 102-$n$ are filled with four times n bits of data. Thus, a given row of NVM MOS field effect transistors, such as transistors Q34-11 through Q34-$n$1, will have their values read out during the 16 steps of the DAC output voltage from DAC 104. A data send signal from the data output control buffer 101 to the data output buffers 102-1 through 102-$n$ on lead 113-1 then sends all of the 4×n bits of data out of the buffers 102-1 through 102-$n$. This completes the read operation for a row of the multi-bit NVM cells such as the cells Q34-11 through Q34-$n$1 in row 1403-1 shown in FIG. 14. Naturally, each of the rows of MOSFET NVM cells shown in FIG. 14 are read out in the same way in a sequence of read operations.

The present invention achieves multi-bit storage of information in a single EEPROM cell in an efficient manner. For breadth of coverage, the term storage layer is used in the following claims to include any structure which will hold charge (either electrons or holes) including a dielectric, micro-particles, or what is known as a floating gate, or any other suitable materials.

Based on the above, those skilled in the art will realize that the embodiments of the present invention described herein are illustrative only and are not in any way limiting. Other embodiments of this invention will be obvious to those skilled in the art in view of this description.

What is claimed is:

1. A non-volatile memory structure comprising:
    a MOSFET including
        a storage layer for storing charge representing any one of N different multi-bit words, where N is a selected integer greater than one; and
        a control gate;
    a source of said N multi-bit words in sequence, said N multi-bit words representing in digital form N different voltage levels;
    a digital-to-analog converter for receiving in sequence said N multi-bit words from said source and for providing to said control gate N different voltage levels corresponding to said N multi-bit words;
    an output buffer for receiving a selected one of said N multi-bit words;
    an output lead for carrying a signal representing the state of said MOSFET; and
    a control circuit responsive to a change in said signal representing the state of said MOSFET, for providing a signal to said output buffer to cause said output buffer to receive a signal or signals corresponding to the value of the multi-bit word represented by the charge stored on the storage layer of said MOSFET.

2. Structure as in claim 1 wherein each of said N different voltage levels from said converter, except the first voltage level, is changed in value by a selected increment from the previous voltage level from said converter.

3. Structure as in claim 1 wherein N equals 4.

4. Structure as in claim 1 wherein N equals 8.

5. Structure as in claim 1 wherein N equals 16.

6. Structure as in claim 1 wherein N equals $2^n$, where n is an integer equal to 2 or more.

7. Structure as in claim 1 wherein said MOSFET is an N-channel MOSFET.

8. Structure as in claim 1 wherein said MOSFET is a P-channel MOSFET.

9. Structure as in claim 1 wherein said MOSFET is replaced by a P-channel MOSFET connected in series with an N-channel MOSFET thereby to provide a CMOS cell.

10. Structure as in claim 9 wherein said P-channel MOSFET and said N-channel MOSFET share a common control gate and a common storage layer.

11. Structure as in claim 9 wherein said P-channel MOSFET is connected between a supply voltage and the drain of the N-channel MOSFET and said N-channel MOSFET is connected between the drain of said P-channel MOSFET and ground.

12. Structure as in claim 11 wherein said output lead is connected to a node between said P-channel MOSFET and said N-channel MOSFET.

13. Structure as in claim 1 including a comparator arranged to detect, and produce an intermediate signal in response to, a change in the signal on said output lead, said change representing a match between the voltage applied to said control gate from said digital-to-analog converter and the threshold voltage of the MOSFET.

14. A method of determining the particular multi-bit value out of N possible values, where N is an integer equal to two or more, stored on a storage layer of a MOSFET in a non-volatile memory cell, said MOSFET also including a control gate, which comprises:
    applying in sequence a series of voltages to said control gate, said voltages changing incrementally as a function of time;
    monitoring the output signal on an output lead controlled by said MOSFET to determine when the MOSFET changes from one state to another state by detecting a change in said output signal in response to said MOSFET changing from one state to another state; and
    using the change in said output signal to identify the particular one of said N possible values which is stored on said storage layer;
    wherein said step of applying in sequence a series of voltages to said control gate comprises:
        generating a sequence of binary code words, each binary code word changing in value by a selected amount from the previous binary code word;
        applying each binary code word in said sequence to a digital-to-analog converter and also to a buffer, said digital-to-analog converter producing a unique output signal in response to each binary code word;
        applying each output signal from said digital-to-analog converter to the control gate of a MOSFET having a storage layer;
        detecting the particular code word which causes the MOSFET to transition from one state to another state; and providing, in response to the change in the operating state of the MOSFET, the value of said particular code word to said buffer for said buffer to provide to an output terminal or bus.

15. The method of claim 14 wherein using the change in said output signal comprises:
applying said output signal to a control circuit which in response to said change in said output signal uses the voltage being applied to a control gate of said MOSFET to identify the particular value which is stored on said storage layer.

16. The method of claim 15 wherein N is $2^n$, where n is an integer equal to two (2) or more.

17. The method of claim 14 wherein said MOSFET comprises a source region, a drain region, a channel region between said source region and said drain region, said control gate being above, but separated by dielectric from, said underlying channel region, and said storage layer being formed in said dielectric between said control gate and said channel region, said storage layer being capable of holding any one of N different charges to represent any one of N different multi-bit words.

18. A non-volatile memory structure comprising:
a MOSFET including a storage layer and a control gate;
a digital-to-analog converter connected to provide at least two different voltages to said control gate;
a source of at least two digital multi-bit words representing said at least two different voltages;
an output buffer for receiving a selected one of said at least two digital multi-bit words;
a load connected in series with said MOSFET to provide a node between said load and said MOS transistor;
a comparator arranged to determine a change in signal at said node, said change representing a change in state of said MOSFET as a result of a voltage applied to said control gate matching the threshold voltage of said MOSFET; and
a control circuit for detecting said change in output voltage from the comparator, said control circuit providing a signal to the output buffer thereby to allow the output buffer to receive one or more signals representing the value of the voltage from said converter applied to said control gate which causes said change in state of said MOSFET, said control voltage corresponding to the multi-bit data stored on the storage layer of said MOSFET.

19. Structure as in claim 18 wherein said at least two different voltages from said converter comprise N voltage levels, where N is an integer equal to or greater than two.

20. Structure as in claim 19 wherein N equals 8.

21. Structure as in claim 19 wherein N equals 16.

22. Structure as in claim 19 wherein N equals $2^n$, where n is an integer equal to 2 or more.

23. Structure as in claim 18 wherein said MOSFET is an N-channel MOS transistor.

24. Structure as in claim 18 wherein said MOSFET is a P-channel MOS transistor.

25. Structure as in claim 18 wherein said MOSFET is replaced by a P-channel MOS transistor connected in series with an N-channel MOS transistor thereby to provide a CMOS cell.

26. Structure as in claim 25 wherein said P-channel MOS transistor and said N-channel MOS transistor share a common control gate.

27. Structure as in claim 26 wherein said P-channel MOS transistor is connected between a supply voltage and a drain of the N-channel MOS transistor and said N-channel MOS transistor is connected between the drain of said P-channel MOS transistor and ground.

28. Structure as in claim 27 wherein the output voltage from said series connected P-channel MOS transistor and said N-channel MOS transistor is taken from a node between said two transistors.

29. A method for determining the particular multi-bit value stored in a non-volatile memory cell which comprises:
storing a selected charge corresponding to a multi-bit word on the floating gate of an MOS transistor which comprises a source region, a drain region, a channel region between the source and drain region, a control gate separated by a dielectric from said underlying channel region, and a storage layer formed in said dielectric between said control gate and said channel region, said storage layer being adapted to hold any one of N different charges to represent any one of a corresponding number of multi-bit values, where N is a selected number;
applying in sequence a series of voltages to said control gate, said voltages changing incrementally as a function of time;
monitoring the output voltage from said MOS transistor to determine when the MOS transistor changes from one state to another state;
producing an output signal at the time said MOSFET changes from one state to another state; and
applying said output signal to a control circuit which causes to be provided on an output terminal or bus one or more signals representing the voltage applied to the control gate which changed the state of said MOS transistor, said voltage corresponding to the charge stored on said storage layer;
wherein said step of applying in sequence a series of voltages to said control gate comprises:
generating a sequence of binary code words, each binary code word changing in value by a selected amount from the previous binary code word;
applying said binary code words to a digital-to-analog converter and also to a buffer;
detecting the particular code word which causes the MOS transistor to transition from one state to another state; and
providing, in response to the change in the operating state of the MOS transistor, the value of said particular code word to the buffer for transmission to an output terminal.

30. The method of claim 29 wherein N is $2^n$, where n is an integer of 2 or more.

* * * * *